US012795943B2

(12) United States Patent
Park et al.

(10) Patent No.: US 12,795,943 B2
(45) Date of Patent: Nov. 10, 2026

(54) SEMICONDUCTOR DEVICES

(71) Applicant: Samsung Electronics Co., Ltd., Suwon-si (KR)

(72) Inventors: Jungmin Park, Suwon-si (KR); Hanjin Lim, Suwon-si (KR); Ji-Sung Kim, Suwon-si (KR); Hyungsuk Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 350 days.

(21) Appl. No.: 18/417,089

(22) Filed: Jan. 19, 2024

(65) Prior Publication Data

US 2024/0389348 A1 Nov. 21, 2024

(30) Foreign Application Priority Data

May 17, 2023 (KR) ........................ 10-2023-0063735

(51) Int. Cl.

| | |
|---|---|
| ***H10B 53/30*** | (2023.01) |
| ***H10B 53/10*** | (2023.01) |
| ***H10D 1/68*** | (2025.01) |

(52) U.S. Cl.

CPC ............. *H10B 53/30* (2023.02); *H10B 53/10* (2023.02); *H10D 1/684* (2025.01); *H10D 1/716* (2025.01)

(58) Field of Classification Search

None

See application file for complete search history.

(56) References Cited

U.S. PATENT DOCUMENTS

| | | | |
|---|---|---|---|
| 7,527,984 | B2 | 5/2009 | Yamakawa et al. |
| 11,257,899 | B2 | 2/2022 | Kim et al. |
| 11,264,448 | B2 | 3/2022 | Lee et al. |
| 11,527,646 | B2 | 12/2022 | Heo et al. |
| 2021/0183993 | A1 | 6/2021 | Kim et al. |
| 2022/0285374 | A1 | 9/2022 | Lee et al. |

FOREIGN PATENT DOCUMENTS

| | | |
|---|---|---|
| KR | 20020069301 A | 8/2002 |

*Primary Examiner* — Anthony Ho

(74) *Attorney, Agent, or Firm* — Wolf, Greenfield & Sacks, P.C.

(57) ABSTRACT

A semiconductor device includes a capacitor structure. The capacitor structure includes a lower electrode, a dielectric layer on the lower electrode, an upper electrode on the dielectric layer, and a defect preventing layer between the lower electrode and the upper electrode. The defect preventing layer includes at least one of a first defect preventing layer between the lower electrode and the dielectric layer or a second defect preventing layer between the upper electrode and the dielectric layer. The dielectric layer includes a ferroelectric layer that includes at least one of a ferroelectric material or an anti-ferroelectric material. The ferroelectric layer includes a polarization region and a non-polarization region surrounded by the polarization region.

20 Claims, 17 Drawing Sheets

SEMICONDUCTOR DEVICES

CROSS-REFERENCE TO RELATED APPLICATION(S)

This U.S. non-provisional patent application claims priority under 35 U.S.C. § 119 to Korean Patent Application No. 10-2023-0063735, filed on May 17, 2023, in the Korean Intellectual Property Office, the entire contents of which are hereby incorporated by reference.

BACKGROUND

The present disclosure relates to semiconductor devices, and more particularly, to semiconductor memory devices.

Semiconductor devices are widely used in an electronic industry because of their small sizes, multi-functional characteristics, and/or low manufacturing costs. Semiconductor devices may be categorized as any one of semiconductor memory devices for storing logical data, semiconductor logic devices for processing logical data, and hybrid semiconductor devices having both the function of the semiconductor memory devices and the function of the semiconductor logic devices.

Demand for a capacitor having a sufficient capacitance in a limited area has increased as a semiconductor device has been highly integrated. The capacitance of the capacitor may be proportional to a surface area of an electrode and a dielectric constant of a dielectric layer and may be inversely proportional to an equivalent oxide thickness of the dielectric layer. Recently, various techniques for improving the capacitance of the capacitor have been studied.

SUMMARY

Embodiments of the inventive concepts may provide semiconductor devices with improved electrical characteristics and reliability.

According to some aspects, a semiconductor device may include a capacitor structure. The capacitor structure may include a lower electrode, a dielectric layer on the lower electrode, an upper electrode on the dielectric layer, and a defect preventing layer between the lower electrode and the upper electrode. The defect preventing layer may include at least one of a first defect preventing layer between the lower electrode and the dielectric layer or a second defect preventing layer between the upper electrode and the dielectric layer. The dielectric layer may include a ferroelectric layer that includes at least one of a ferroelectric material or an anti-ferroelectric material. The ferroelectric layer may include a polarization region and a non-polarization region surrounded by the polarization region.

According to some aspects, a semiconductor device may include a capacitor structure. The capacitor structure may include a lower electrode, a dielectric layer on the lower electrode, an upper electrode on the dielectric layer, and a defect preventing layer between the lower electrode and the upper electrode. The defect preventing layer may include at least one of a first defect preventing layer between the lower electrode and the dielectric layer or a second defect preventing layer between the upper electrode and the dielectric layer. A thermal expansion coefficient of the defect preventing layer may be less than a thermal expansion coefficient of the dielectric layer.

According to some aspects, a semiconductor device may include a substrate, conductive contacts on the substrate, lower electrodes on the conductive contacts, a dielectric layer on the lower electrodes, an upper electrode on the dielectric layer, and a defect preventing layer between the upper electrode and the lower electrodes. The defect preventing layer may include at least one of a first defect preventing layer between the dielectric layer and the lower electrodes or a second defect preventing layer between the upper electrode and the dielectric layer. The dielectric layer may include a ferroelectric layer that includes at least one of a ferroelectric material or an anti-ferroelectric material. The ferroelectric layer may include a polarization region and a non-polarization region surrounded by the polarization region.

DETAILED DESCRIPTION

Example embodiments of the inventive concepts will now be described more fully with reference to the accompanying drawings.

FIGS. 1 to 5 are cross-sectional views illustrating capacitor structures of semiconductor devices according to some embodiments of the inventive concepts.

Referring to FIGS. 1 to 5, a semiconductor device may include a capacitor structure CAP. The capacitor structure CAP may function as a data storage element used to operate the semiconductor device according to the inventive concepts as a semiconductor memory device. The capacitor structure CAP may include a lower electrode BE, a dielectric layer DL, and an upper electrode TE, which are sequentially stacked in a vertical direction VD. The vertical direction VD may be a direction substantially perpendicular to a surface of the lower electrode BE and a surface of the upper electrode TE, which face each other. For example, the vertical direction VD may be substantially perpendicular to an upper surface of the lower electrode BE and a lower surface of the upper electrode TE. The dielectric layer DL may be disposed between the lower electrode BE and the upper electrode TE.

Each of the lower electrode BE and the upper electrode TE may include a conductive material. For example, each of the lower electrode BE and the upper electrode TE may include at least one of dopant-doped silicon (Si), dopant-doped silicon-germanium (SiGe), a metal material (e.g., Ti, Mo, W, Cu, Al, Ta, Ru, Ir, Co, Pt, Au, Ag, etc.), a metal nitride (e.g., a nitride of Ti, Mo, W, Cu, Al, Ta, Ru, Ir, Co, Pt, Au, or Ag, titanium silicon nitride (e.g., TiSiN), titanium aluminum nitride (e.g., TiAlN), tantalum aluminum nitride (e.g., TaAlN), etc.), a conductive oxide (e.g., PtO, $RuO_2$, $IrO_2$, $SrRuO_3$ (SRO), $(Ba,Sr)RuO_3$ (BSRO), $CaRuO_3$ (CRO), LSCO, etc.), or a metal silicide. Each of the lower electrode BE and the upper electrode TE may be a single layer formed of a single material or a composite layer including two or more materials.

A defect preventing layer PV may be provided between the lower electrode BE and the upper electrode TE. The defect preventing layer PV may include at least one of a first defect preventing layer PV1 or a second defect preventing layer PV2. The first defect preventing layer PV1 may be disposed between the lower electrode BE and the dielectric layer DL. The second defect preventing layer PV2 may be disposed between the upper electrode TE and the dielectric layer DL. In some embodiments, the defect preventing layer PV, the first defect preventing layer PV1, and/or the second defect preventing layer PV2 may be referred to as a tensile stress layer, an oxygen vacancy reduction layer, and/or an oxide layer.

Figure 1:
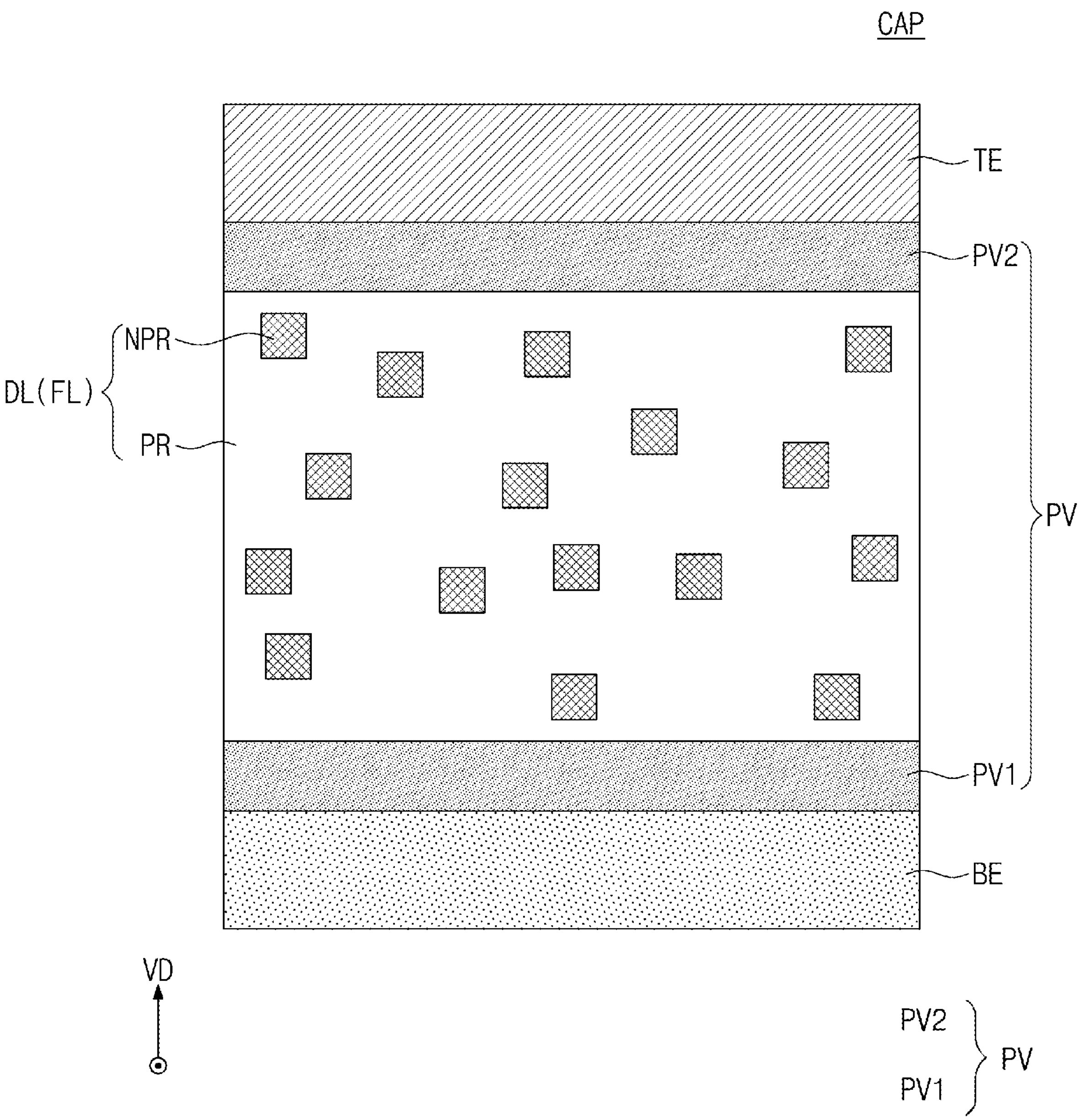
FIGS. 1 to 5 are cross-sectional views illustrating capacitor structures of semiconductor devices according to some embodiments of the inventive concepts.
Figure 2:
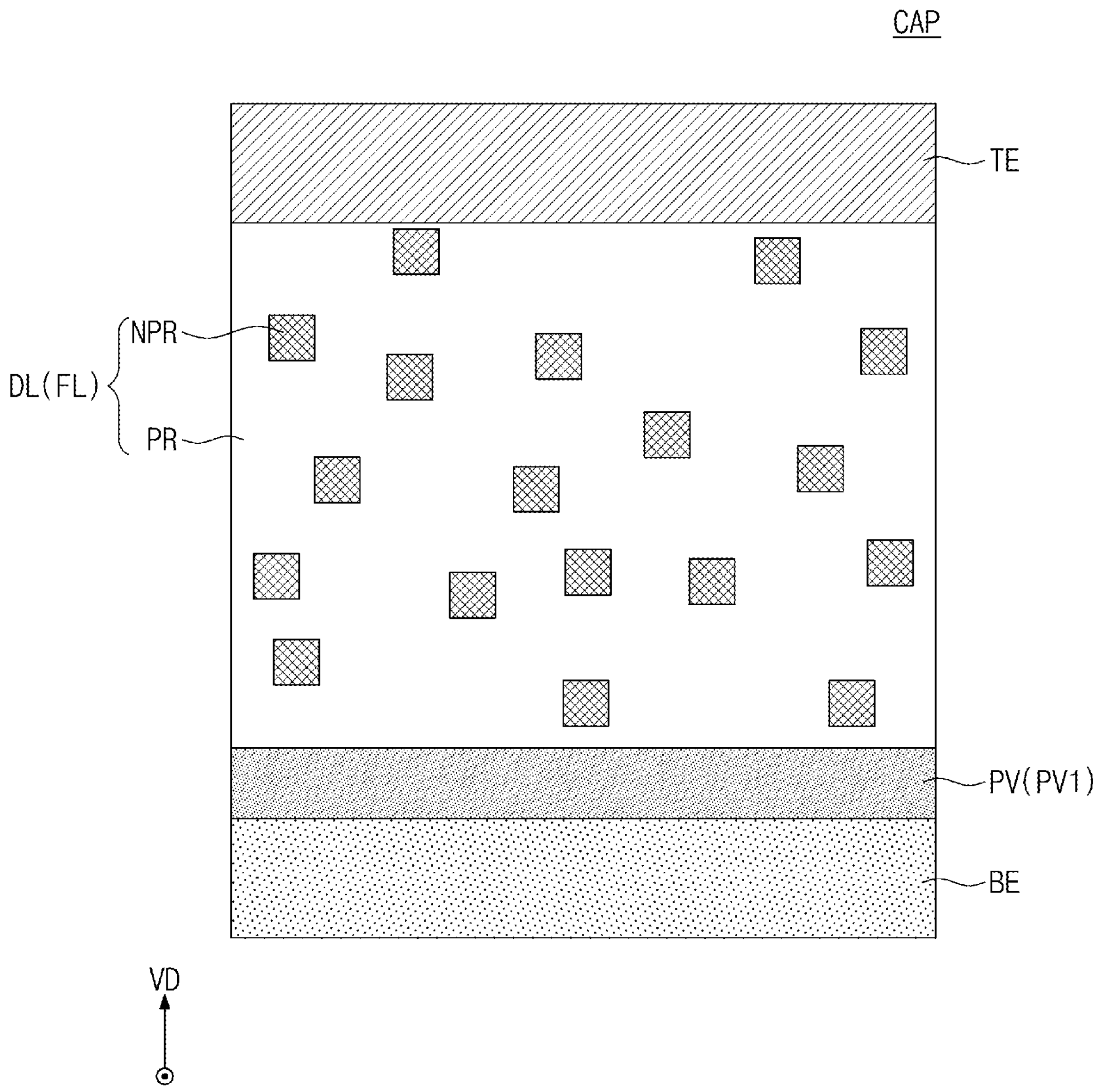
Figure 3:
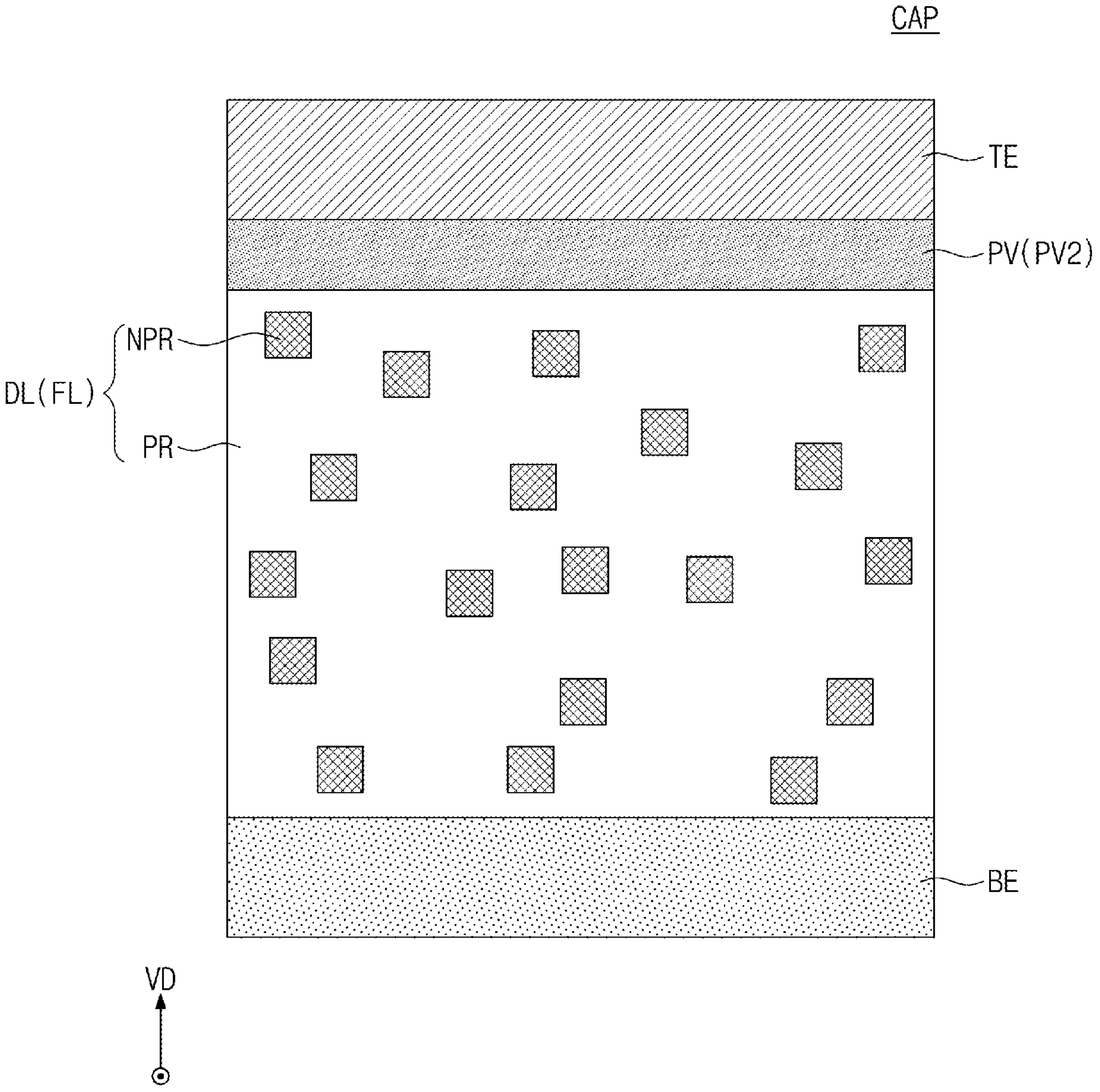

In some embodiments, as shown in FIG. 1, the defect preventing layer PV may include both the first defect preventing layer PV1 and the second defect preventing layer PV2. The lower electrode BE, the first defect preventing layer PV1, the dielectric layer DL, the second defect preventing layer PV2, and the upper electrode TE may be sequentially stacked in the vertical direction VD. In some embodiments, as shown in FIG. 2, the defect preventing layer PV may include the first defect preventing layer PV1 but may not include the second defect preventing layer PV2. The lower electrode BE, the first defect preventing layer PV1, the dielectric layer DL, and the upper electrode TE may be sequentially stacked in the vertical direction VD. In some embodiments, as shown in FIG. 3, the defect preventing layer PV may include the second defect preventing layer PV2 but may not include the first defect preventing layer PV1. The lower electrode BE, the dielectric layer DL, the second defect preventing layer PV2, and the upper electrode TE may be sequentially stacked in the vertical direction VD.

A thermal expansion coefficient of the defect preventing layer PV may be less than a thermal expansion coefficient of the dielectric layer DL. For example, a thermal expansion coefficient of each of the first and second defect preventing layers PV1 and PV2 may be less than the thermal expansion coefficient of the dielectric layer DL. The thermal expansion coefficient of the defect preventing layer PV may be less than a thermal expansion coefficient of the lower electrode BE or the upper electrode TE. For example, the thermal expansion coefficient of the first defect preventing layer PV1 may be less than the thermal expansion coefficient of the lower electrode BE. For example, the thermal expansion coefficient of the second defect preventing layer PV2 may be less than the thermal expansion coefficient of the upper electrode TE. For example, the thermal expansion coefficient of the defect preventing layer PV may be greater than 0 m/K and may be equal to or less than about $5\times10^{-6}$ m/K.

Since the defect preventing layer PV has the thermal expansion coefficient less than that of the dielectric layer DL, the defect preventing layer PV may provide tensile stress to the dielectric layer DL. The dielectric layer DL may include a ferroelectric layer FL to be described later, and the ferroelectric layer FL may include a non-polarization region NPR (to be described later) therein by the tensile stress.

The defect preventing layer PV may reduce defects (e.g., oxygen vacancies) between the lower electrode BE and the dielectric layer DL and/or between the upper electrode TE and the dielectric layer DL. The defects may cause a dipole pinning phenomenon that dipoles are pinned in the ferroelectric layer FL to be described later in detail. When the dipole pinning phenomenon occurs, the ferroelectric layer FL may not have sufficient ferroelectricity or anti-ferroelectricity, and thus electrical characteristics and reliability of the semiconductor device may be deteriorated. Since the defect preventing layer PV reduces the defects, the dipole pinning phenomenon may be reduced or minimized. As a result, the electrical characteristics and reliability of the semiconductor device may be improved.

The defect preventing layer PV may include an oxide material. For example, the defect preventing layer PV may include at least one of silicon oxide or a metal oxide, or the defect preventing layer PV may include at least one of other various oxide materials. In some embodiments, the defect preventing layer PV may include the same kind of an element as at least a portion of the material of the lower electrode BE or the upper electrode TE. For example, the first defect preventing layer PV1 may include the same kind of an element as at least a portion of the material of the lower electrode BE. For example, the second defect preventing layer PV2 may include the same kind of an element as at least a portion of the material of the upper electrode TE. In some embodiments, the defect preventing layer PV may be formed of a material not included in the lower electrode BE or the upper electrode TE. The first defect preventing layer PV1 and the second defect preventing layer PV2 may include the same material or different materials.

Each of the first defect preventing layer PV1 and the second defect preventing layer PV2 may be formed of one or more layers. A thickness, in the vertical direction VD, of each of the first defect preventing layer PV1 and the second defect preventing layer PV2 may be greater than 0 angstroms (Å) and may be equal to or less than about 10 Å. Impurities may further be provided in the defect preventing layer PV. The impurities may include tetravalent or more ions. A concentration of the impurities in the defect preventing layer PV may be greater than 0% and may be equal to or less than about 10%.

The dielectric layer DL may include the ferroelectric layer FL. The ferroelectric layer FL may include at least one of a ferroelectric material, an anti-ferroelectric material, or an electric field-induced phase transition material. Thus, the ferroelectric layer FL may include a polarization region PR therein. As an electric field formed from the lower electrode BE and the upper electrode TE is changed, the polarization region PR may show a P-E hysteresis loop.

The ferroelectric layer FL may further include the non-polarization region NPR therein. In some embodiments, the non-polarization region NPR may have a composition or crystalline phase different from that of the polarization region PR. The non-polarization region NPR may be provided in plurality, and each of the non-polarization regions NPR may be surrounded by the polarization region PR (e.g., in a cross-sectional view). It will be understood that "an element A surrounds an element B" (or similar language) as used herein means that the element A is at least partially around the element B but does not necessarily mean that the element A completely encloses the element B. Even though the electric field formed from the lower electrode BE and the upper electrode TE is changed, the non-polarization region NPR may not show the P-E hysteresis loop. The ferroelectric layer FL may receive the tensile stress from the defect preventing layer PV, and thus a composition or crystalline phase of a partial region of the ferroelectric layer FL may be locally changed. The non-polarization region NPR may be the partial region of the ferroelectric layer FL.

When the aforementioned dipole pinning phenomenon occurs in a grain in the polarization region PR, a pinned dipole may affect dipoles of crystalline peripheral grains. In other words, dipole propagation may occur, and the dipole propagation may mean a phenomenon that even though the dipole pinning phenomenon occurs in only a portion of the polarization region PR, the dipole pinning affects another portion of the polarization region PR. According to the inventive concepts, the ferroelectric layer FL may include the non-polarization region NPR, and the non-polarization region NPR may prevent the dipole propagation toward another portion of the polarization region PR even though the dipole pinning phenomenon occurs in a portion of the polarization region PR adjacent to the non-polarization region NPR. As a result, the electrical characteristics and reliability of the semiconductor device may be improved.

In the ferroelectric layer FL, an occupied volume of the non-polarization region NPR may be less than an occupied volume of the polarization region PR. For example, the occupied volume of the non-polarization region NPR in the ferroelectric layer FL may range from about 5% to about 30% of a total volume of the ferroelectric layer FL. If the volume of the non-polarization region NPR is less than about 5% of the total volume of the ferroelectric layer FL, the dipole propagation may not be effectively prevented. If the volume of the non-polarization region NPR is greater than about 30% of the total volume of the ferroelectric layer FL, the ferroelectric layer FL may not have sufficient ferroelectricity or anti-ferroelectricity.

Figure 4:
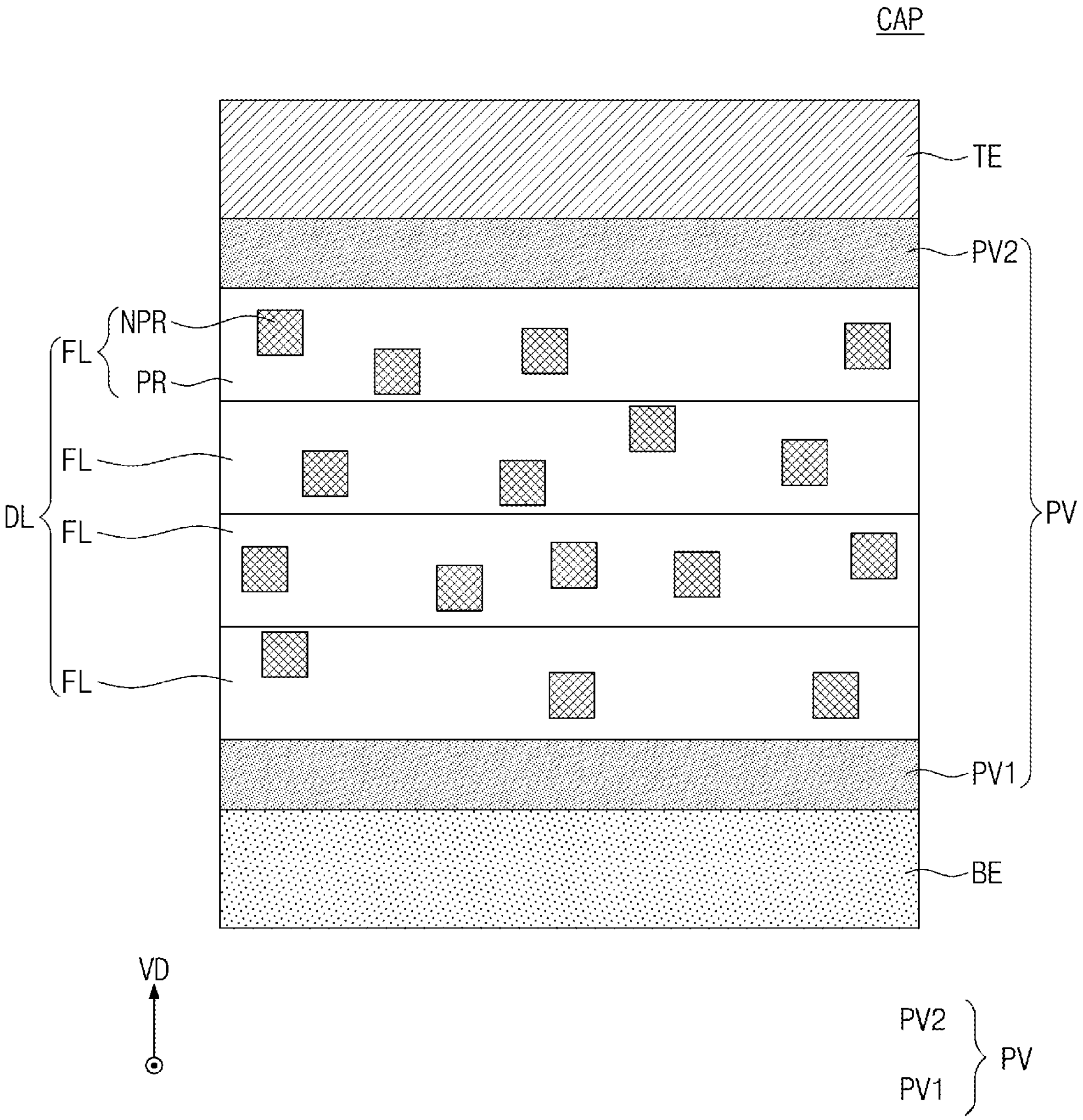

For example, the ferroelectric layer FL may include at least one of $PbZrO_3$, $AgNbO_3$, $ZrO_2$, $HfZrO_2$, $BaTiO_3$, $HfO_2$, $BiFeO_3$, PbTiO, or $Hf_{0.5}Zr_{0.5}O_2$. The ferroelectric layer FL may be formed of one or more layers. For example, as shown in FIG. 1, the ferroelectric layer FL may be formed of a single layer. As another example, as shown in FIG. 4, the ferroelectric layer FL may be formed of a plurality of layers.

Figure 5:
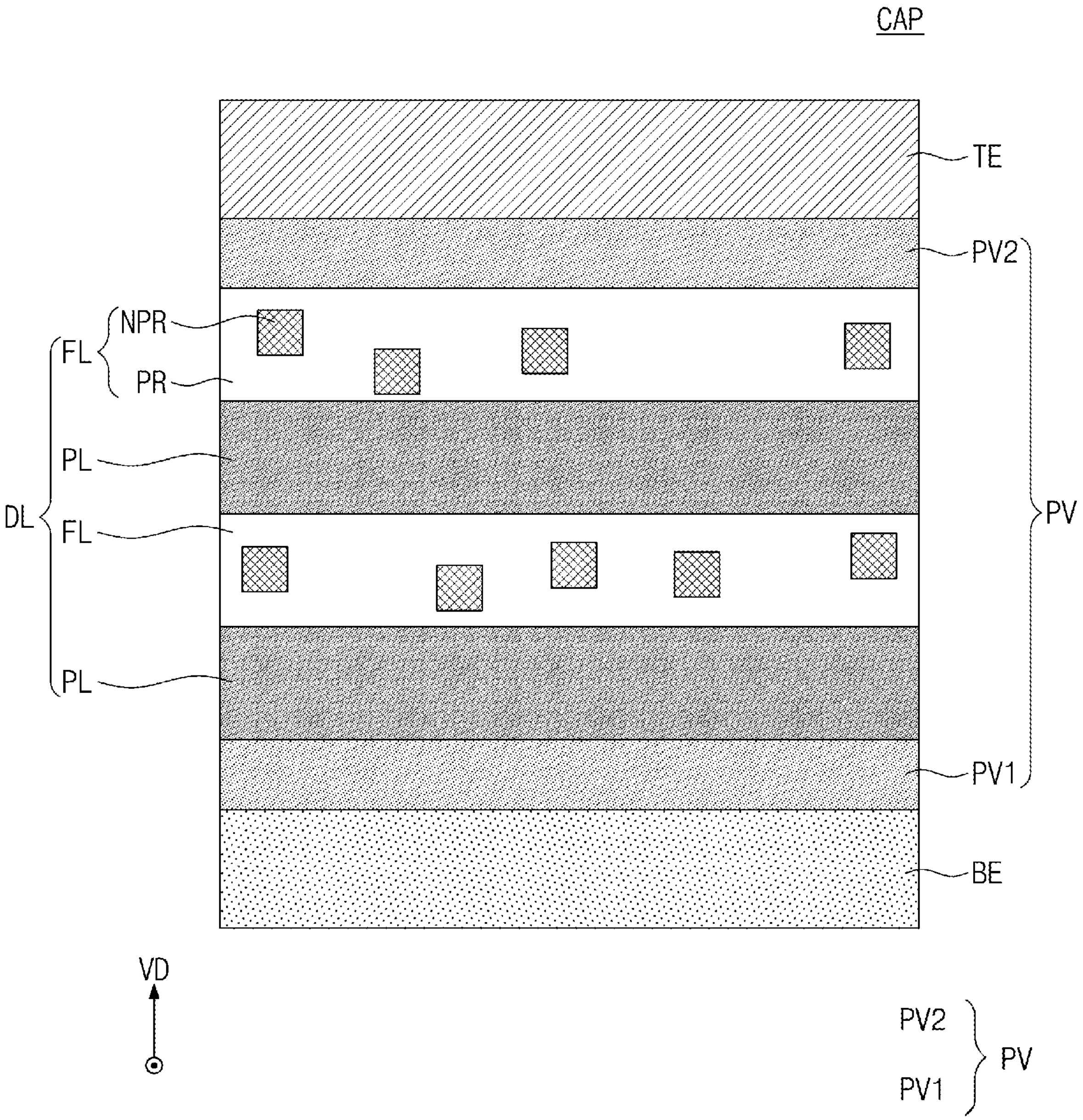

The dielectric layer DL may further include a paraelectric layer PL (see FIG. 5). The paraelectric layer PL may be formed of one or more layers. The arrangement and the numbers of the ferroelectric layer(s) FL and the paraelectric layer(s) PL may be variously changed. The paraelectric layer PL may include a paraelectric material. For example, the paraelectric layer PL may include at least one of a metal oxide (e.g., $HfO_2$, $ZrO_2$, $Al_2O_3$, $La_2O_3$, $Ta_2O_3$, $TiO_2$, etc.) or a dielectric material having a perovskite structure (e.g., $SrTiO_3$ (STO), $(Ba,Sr)TiO_3$ (BST), $BaTiO_3$, PZT, PLZT, etc.).

Figure 6:
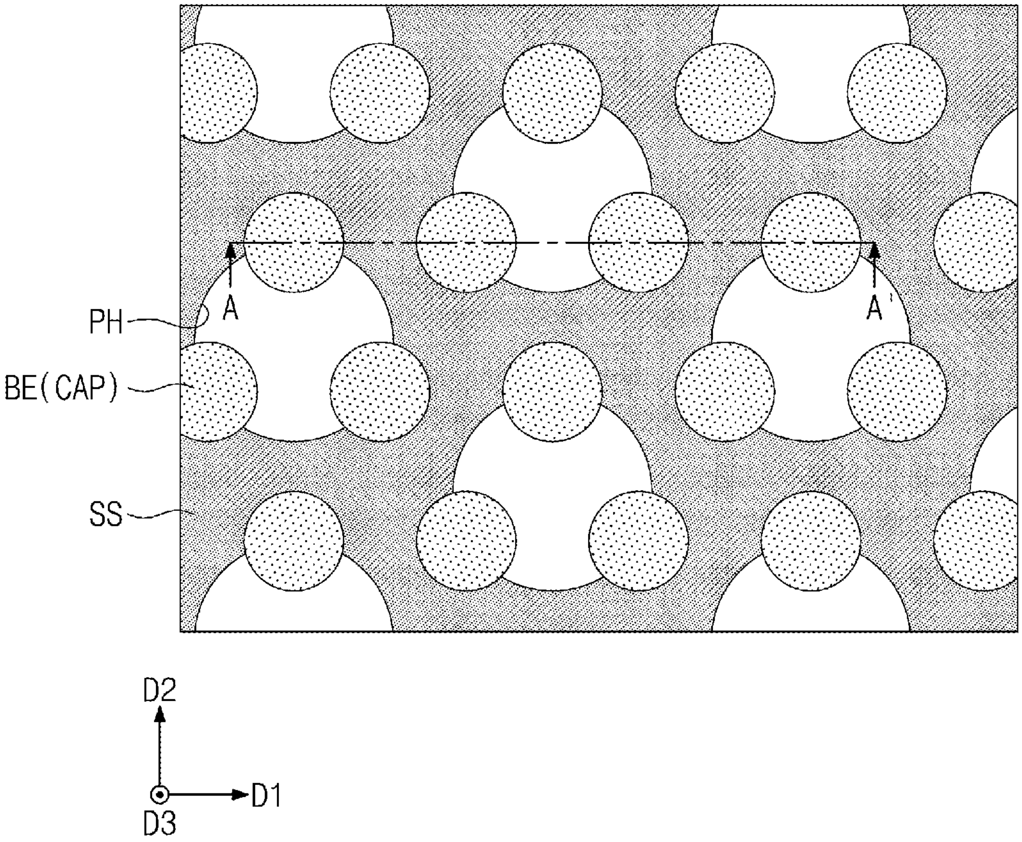
FIG. 6 is a plan view illustrating a semiconductor device according to some embodiments of the inventive concepts.
Figure 7:
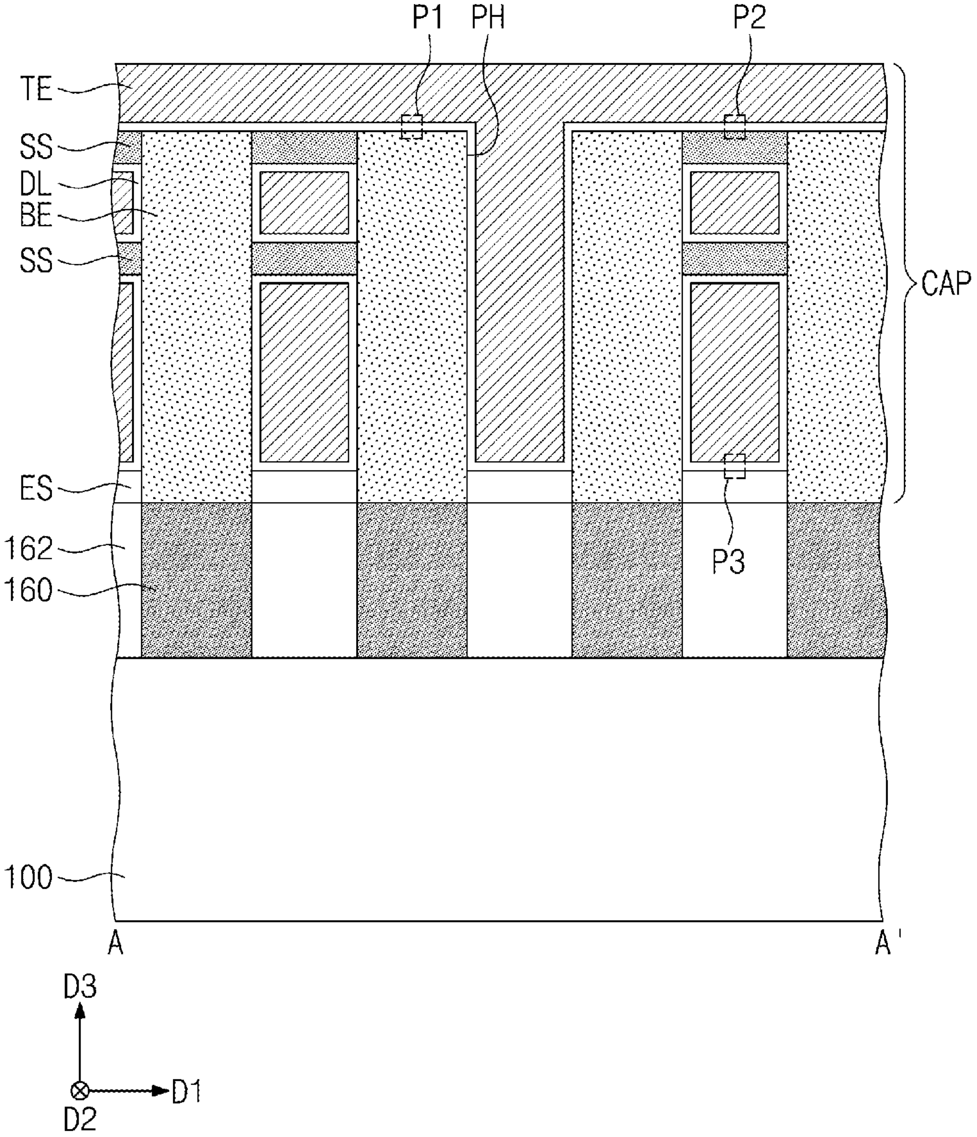
FIG. 7 is a cross-sectional view taken along a line A-A' of FIG. 6.
Figure 8:
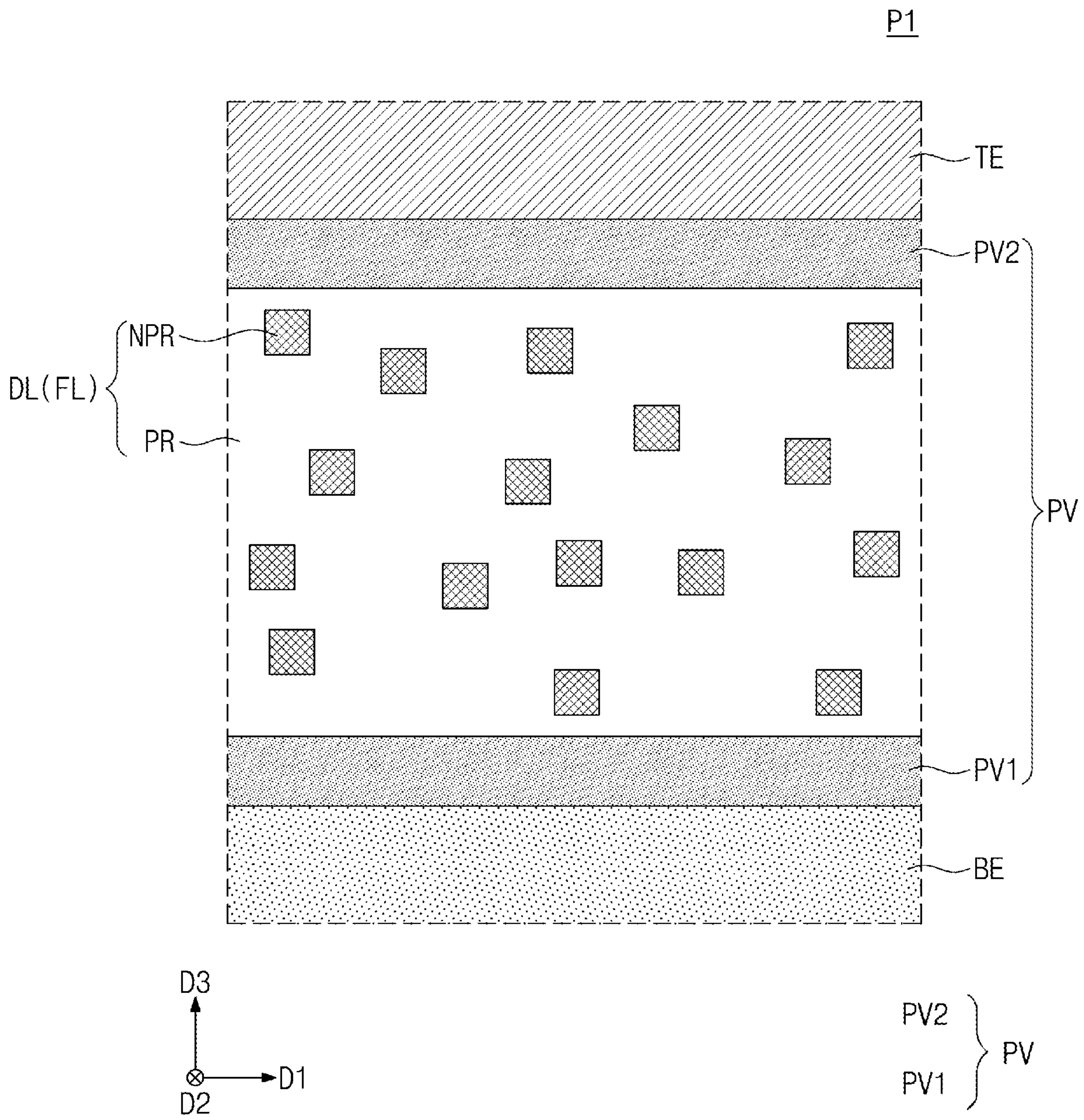
FIGS. 8, 9, and 10 are enlarged views of portions ‘P1’, ‘P2’ and ‘P3’ of FIG. 7, respectively.
Figure 9:
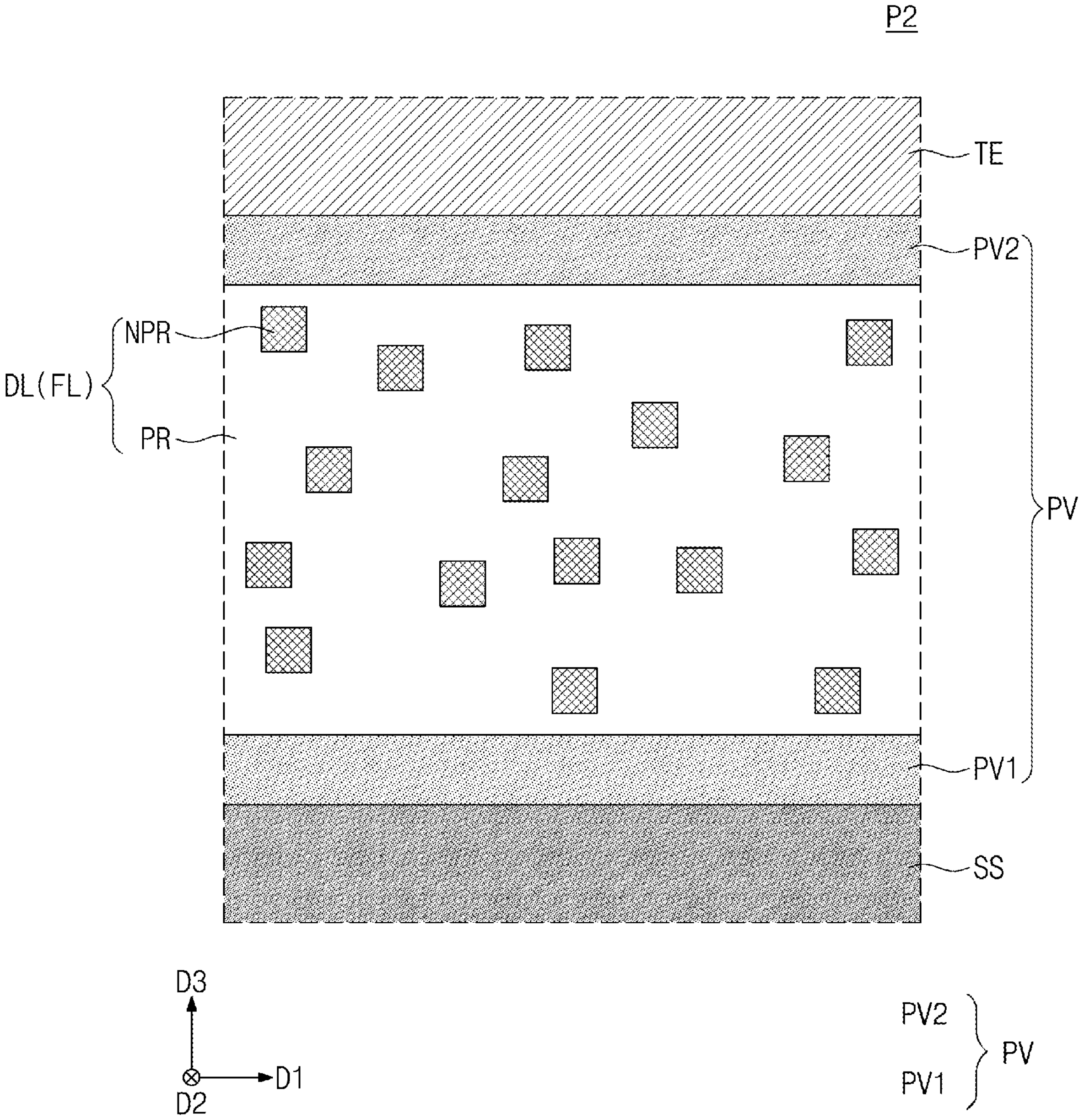
Figure 10:
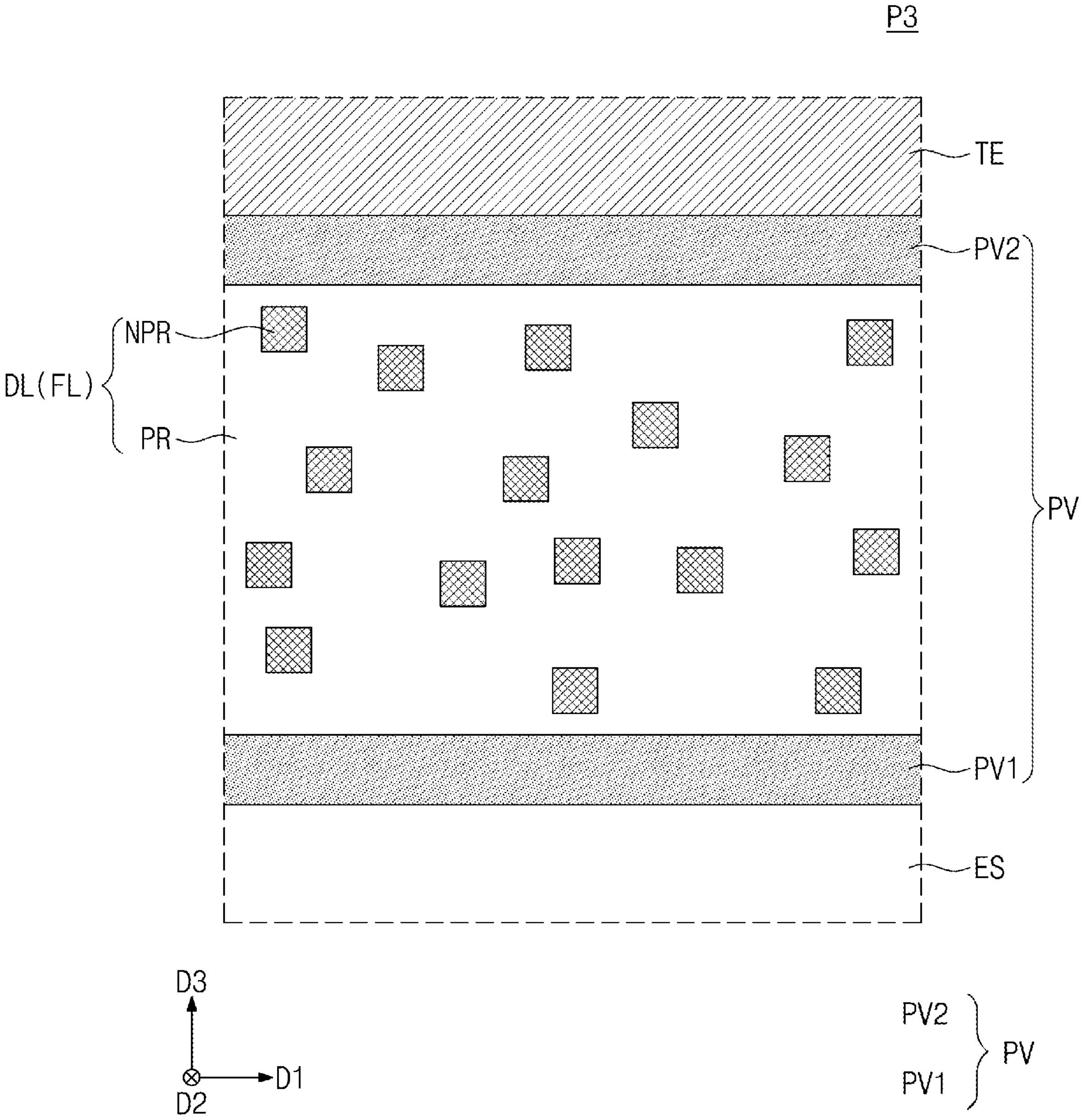

FIG. 6 is a plan view illustrating a semiconductor device according to some embodiments of the inventive concepts. FIG. 7 is a cross-sectional view taken along a line A-A' of FIG. 6. FIGS. 8, 9, and 10 are enlarged views of portions 'P1', 'P2' and 'P3' of FIG. 7, respectively. Hereinafter, the descriptions to the same features as mentioned above will be omitted for the purpose of ease and convenience in explanation.

Referring to FIGS. 6 to 10, a substrate 100 may be provided. The substrate 100 may be a semiconductor substrate. For example, the substrate 100 may be a silicon substrate, a germanium substrate, or a silicon-germanium substrate.

An interlayer insulating layer 162 may be disposed on the substrate 100. The interlayer insulating layer 162 may cover at least a portion of a top surface of the substrate 100. For example, the interlayer insulating layer 162 may include at least one of silicon nitride, silicon oxide, or silicon oxynitride. In some embodiments, the interlayer insulating layer 162 may include an empty region.

A conductive contact 160 may be disposed in the interlayer insulating layer 162. The conductive contact 160 may be provided in plurality, and the conductive contacts 160 may be spaced apart from each other in a first direction D1 and a second direction D2 which are parallel to a bottom surface of the substrate 100 and intersect each other (e.g., are perpendicular to each other). The conductive contact 160 may include at least one of a dopant-doped semiconductor material (e.g., doped poly-silicon), a metal material (e.g., Ti, Mo, W, Cu, Al, Ta, Ru, Ir, Co, Pt, Au, Ag, etc.), a metal nitride (e.g., a nitride of Ti, Mo, W, Cu, Al, Ta, Ru, Ir, Co, Pt, Au, or Ag), or a metal silicide (e.g., a silicide of Ti, Mo, W, Cu, Al, Ta, Ru, Ir, Co, Pt, Au, or Ag). The conductive contact 160 may be electrically connected to a dopant region (e.g., a source/drain terminal) formed in the substrate 100.

A capacitor structure CAP, an etch stop layer ES, and a supporting layer SS may be provided on the conductive contacts 160. The capacitor structure CAP may correspond to one of the capacitor structures CAP of FIGS. 1 to 5 and thus may include the lower electrode BE, the dielectric layer DL, the upper electrode TE, and the defect preventing layer PV.

The etch stop layer ES may be disposed on the interlayer insulating layer 162. The etch stop layer ES may cover the interlayer insulating layer 162 and may expose the conductive contacts 160. The etch stop layer ES may include at least one of silicon oxide, SiCN, or SiBN.

The lower electrode BE may be disposed on the conductive contact 160. The lower electrode BE may penetrate (i.e., extend into) the etch stop layer ES and may be electrically connected to the conductive contact 160. A lower portion of the lower electrode BE may be surrounded by the etch stop layer ES. In some embodiments, as shown in FIG. 7, the lower electrode BE may have a pillar shape. In some embodiments, even though not shown in the drawings, the lower electrode BE may have a hollow cylinder shape having one closed end. In some embodiments, even though not shown in the drawings, the lower electrode BE may have a pillar-shaped lower portion and a hollow cylinder-shaped upper portion.

The lower electrode BE may be provided in plurality, and the lower electrodes BE may be spaced apart from each other in the first direction D1 and the second direction D2. For example, the lower electrodes BE may be arranged in a honeycomb form when viewed in a plan view. More particularly, six lower electrodes BE may be arranged around one lower electrode BE to surround the one lower electrode BE in a hexagonal form in a plan view.

The supporting layer SS may be provided on the substrate 100. The supporting layer SS may be provided between the lower electrodes BE adjacent to each other. The supporting layer SS may be in contact with a side surface of the lower electrode BE and may surround the side surface of the lower electrode BE. The supporting layer SS may physically support the lower electrode BE.

The supporting layer SS may be provided in plurality, and the supporting layers SS may be spaced apart from each other in a third direction D3 perpendicular to the bottom surface of the substrate 100. Thicknesses of the supporting layers SS in the third direction D3 may be different from each other. A top surface of an uppermost one of the supporting layers SS may be located at a different height than a top surface of the lower electrode BE or may be located at substantially the same height as the top surface of the lower electrode BE. For example, height may be relative to the bottom surface of the substrate 100. For example, the supporting layer SS may include at least one of silicon nitride, SiBN, or SiCN.

A through-hole PH may be disposed between the lower electrodes BE adjacent to each other. For example, the through-hole PH may be disposed in a circular shape between three lower electrodes BE adjacent to each other and may expose portions of the side surfaces of the three lower electrodes BE. However, embodiments of the inventive concepts are not limited thereto, and in some embodiments, the through-hole PH may be disposed in one of other various shapes between a plurality of the lower electrodes BE. The through-hole PH may penetrate the supporting layer SS. The through-hole PH may expose the etch stop layer ES. The through-hole PH may be provided in plurality, and the through-holes PH may be spaced apart from each other in the first direction D1 and the second direction D2.

The upper electrode TE may be provided on the lower electrode BE. The upper electrode TE may cover the lower electrode BE and the supporting layer SS. The upper electrode TE may fill the through-holes PH, a space between the lower electrodes BE, a space between the supporting layers SS, and a space between a lowermost one of the supporting layers SS and the etch stop layer ES. For example, the etch stop layer ES may be between the substrate 100 and the upper electrode TE.

The dielectric layer DL may be disposed between each of the lower electrodes BE and the upper electrode TE. The dielectric layer DL may extend between the supporting layer SS and the upper electrode TE and between the etch stop layer ES and the upper electrode TE. The dielectric layer DL may conformally cover the supporting layer SS, the lower electrodes BE and the etch stop layer ES. The dielectric layer DL may fill the through-holes PH together with the upper electrode TE.

The defect preventing layer PV may be provided between the lower electrode BE and the upper electrode TE (see FIG. 8). The defect preventing layer PV may include at least one of the first defect preventing layer PV1 or the second defect preventing layer PV2. Even though not shown in the drawings, the defect preventing layer PV may fill the through-holes PH together with the dielectric layer DL and the upper electrode TE.

The defect preventing layer PV may also be disposed between the supporting layer SS and the upper electrode TE (see FIG. 9). In the case in which the defect preventing layer PV includes the first defect preventing layer PV1, the first defect preventing layer PV1 may be disposed between the supporting layer SS and the dielectric layer DL. The first defect preventing layer PV1 may conformally cover the supporting layer SS. Structural features of the defect preventing layer PV between the supporting layer SS and the upper electrode TE may be similar to the structural features of one of the defect preventing layers PV described with reference to FIGS. 1 to 5 except that the lower electrode BE is changed into the supporting layer SS.

The defect preventing layer PV may also be disposed between the etch stop layer ES and the upper electrode TE (see FIG. 10). In the case in which the defect preventing layer PV includes the first defect preventing layer PV1, the first defect preventing layer PV1 may be disposed between the etch stop layer ES and the dielectric layer DL. The first defect preventing layer PV1 may conformally cover the etch stop layer ES. Structural features of the defect preventing layer PV between the etch stop layer ES and the upper electrode TE may be similar to the structural features of one of the defect preventing layers PV described with reference to FIGS. 1 to 5 except that the lower electrode BE is changed into the etch stop layer ES.

Figure 11:
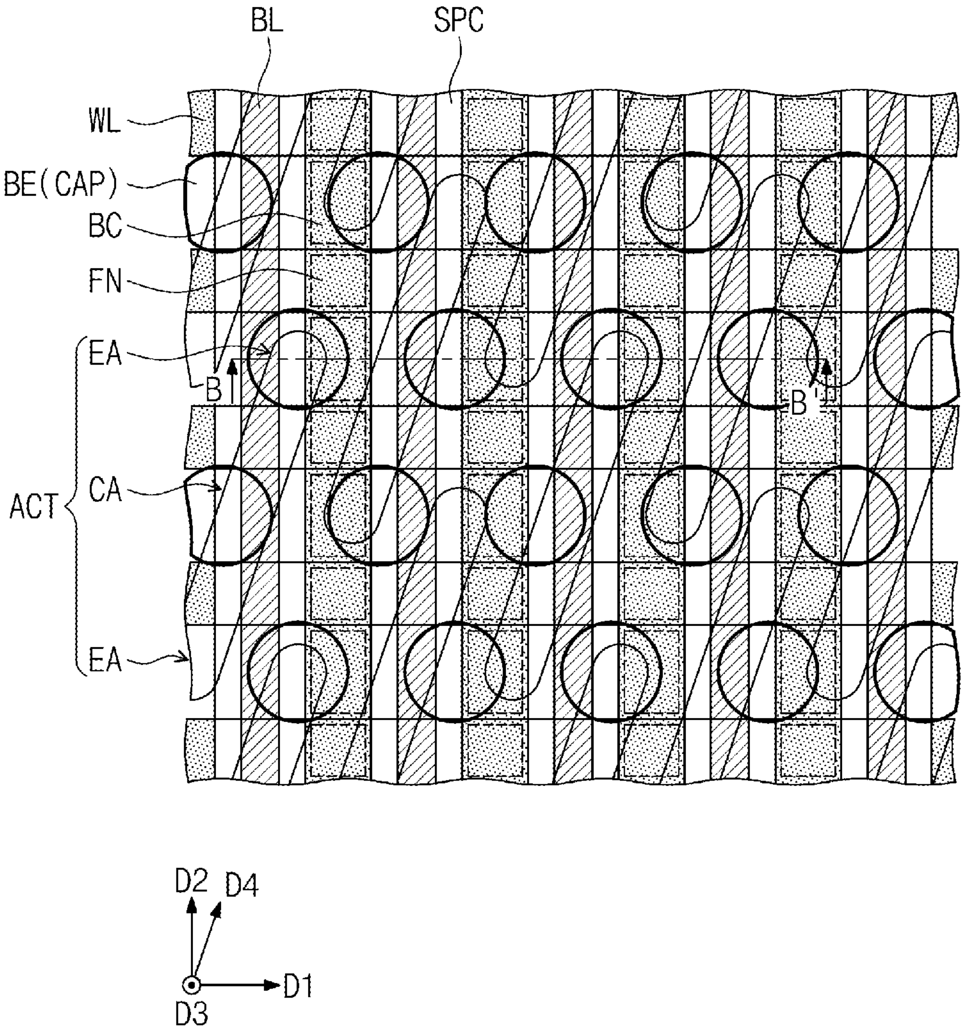
FIG. 11 is a plan view illustrating a semiconductor device according to some embodiments of the inventive concepts.
Figure 12:
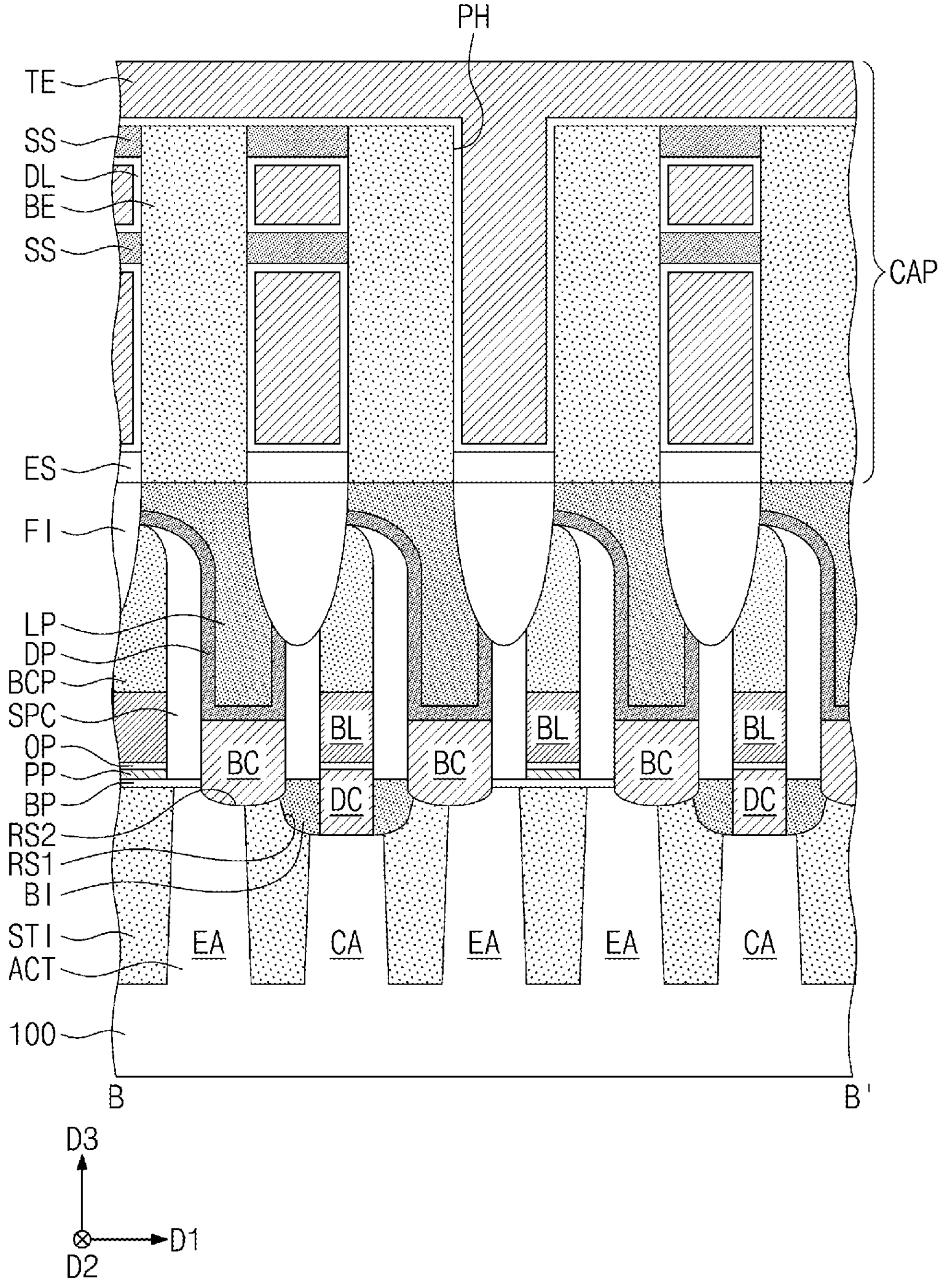
FIG. 12 is a cross-sectional view taken along a line B-B' of FIG. 11.

FIG. 11 is a plan view illustrating a semiconductor device according to some embodiments of the inventive concepts. FIG. 12 is a cross-sectional view taken along a line B-B' of FIG. 11. Hereinafter, the descriptions to the same features as mentioned above will be omitted for the purpose of ease and convenience in explanation.

Referring to FIGS. 11 and 12, a substrate 100 may be provided. The substrate 100 may correspond to the substrate 100 of FIG. 7.

A device isolation pattern STI may be disposed on the substrate 100. The device isolation pattern STI may define active patterns ACT on the substrate 100. Each of the active patterns ACT may have a shape protruding in the third direction D3. For example, the device isolation pattern STI may be disposed in the substrate 100, and the active patterns ACT may be portions of the substrate 100, which are surrounded by the device isolation pattern STI in a plan view. In the present specification, the substrate 100 may be defined as a portion of the substrate 100 that does not include the active patterns ACT unless otherwise stated, for the purpose of ease and convenience in explanation.

The active patterns ACT may be spaced apart from each other in the first direction D1 and the second direction D2. The active patterns ACT may have island shapes separated from each other and may have bar shapes extending in a fourth direction D4. The fourth direction D4 may be parallel to the bottom surface of the substrate 100 and may intersect the first and second directions D1 and D2.

Each of the active patterns ACT may include a pair of edge portions EA and a center portion CA. The pair of edge portions EA may be both end portions of the active pattern ACT in the fourth direction D4, respectively. The center portion CA may be a portion of the active pattern ACT disposed between the pair of edge portions EA, and more particularly, may be a portion of the active pattern ACT disposed between a pair of word lines WL to be described later. The pair of edge portions EA and the center portion CA may include dopant regions doped with dopants (e.g., n-type or p-type dopants), respectively.

The device isolation pattern STI may include an insulating material. For example, the device isolation pattern STI may include at least one of silicon oxide or silicon nitride. For example, the device isolation pattern STI may be a single layer formed of one of the materials or a composite layer formed of two or more materials.

A word line WL may intersect the active patterns ACT. For example, the word line WL may intersect the active patterns ACT and the device isolation pattern STI in the first direction D1. The word line WL may be provided in plurality. The plurality of word lines WL may be spaced apart from each other in the second direction D2. For example, a pair of the word lines WL adjacent to each other in the second direction D2 may intersect one active pattern ACT.

In some embodiments, each of the word lines WL may include a gate electrode (not shown), a gate insulating pattern (not shown) and a gate capping pattern (not shown). The gate electrode may intersect the active patterns ACT and the device isolation pattern STI in the first direction D1. The gate insulating pattern may be disposed between the gate electrode and the active patterns ACT. The gate capping pattern may cover a top surface of the gate electrode.

A buffer pattern BP may be disposed on the substrate 100. The buffer pattern BP may cover the active patterns ACT, the device isolation pattern STI, and the word lines WL. For example, the buffer pattern BP may include at least one of silicon oxide, silicon nitride, or silicon oxynitride. The buffer pattern BP may be a single layer formed of a single material or a composite layer including two or more materials.

A bit line node contact DC may be provided on each of the active patterns ACT, and in other words, the bit line node contact DC may be provided in plurality. Each of the bit line node contacts DC may be connected to a corresponding one of the center portions CA of the active patterns ACT. The bit line node contacts DC may be spaced apart from each other in the first and second directions D1 and D2. The bit line node contacts DC may be disposed between the active patterns ACT and bit lines BL to be described later, respectively. Each of the bit line node contacts DC may connect a corresponding one of the bit lines BL to the center portion CA of a corresponding one of the active patterns ACT. For example, the bit line node contact DC may include poly-silicon doped with dopants.

The bit line node contacts DC may be disposed in first recess regions RS1, respectively. The first recess regions RS1 may be provided in upper portions of the active patterns ACT and an upper portion of the device isolation pattern STI adjacent to the upper portions of the active patterns ACT. The first recess regions RS1 may be spaced apart from each other in the first and second directions D1 and D2.

A buried insulating pattern BI may fill the first recess regions RS1, respectively. The buried insulating pattern BI may fill the inside of the first recess region RS1. For example, the buried insulating pattern BI may cover an inner surface of the first recess region RS1, and at least a portion of a side surface of the bit line node contact DC (e.g., at least a portion of the side surface of the bit line node contact DC in the first recess region RS1). The buried insulating pattern BI may include at least one of silicon oxide, silicon nitride, or a combination thereof. The buried insulating pattern BI may be a single layer formed of a single material or a composite layer including two or more materials.

A bit line BL may be provided on the bit line node contact DC. The bit line BL may be disposed on the bit line node contacts DC arranged in a line in the second direction D2. The bit line BL may be provided in plurality. The bit lines BL may be spaced apart from each other in the first direction D1. The bit line BL may include a metal material. For example, the bit line BL may include a metal material (e.g., Ti, Mo, W, Cu, Al, Ta, Ru, Ir, Co, Pt, Au, Ag, etc.).

A poly-silicon pattern PP may be disposed between the bit line BL and the buffer pattern BP. A top surface of the poly-silicon pattern PP may be located at substantially the same height as a top surface of the bit line node contact DC. The poly-silicon pattern PP may include poly-silicon doped with dopants.

An ohmic pattern OP may be disposed between the bit line BL and the bit line node contact DC and between the bit line BL and the poly-silicon pattern PP. The ohmic pattern OP may include a metal silicide (e.g., a silicide of Ti, Mo, W, Cu, Al, Ta, Ru, Ir, Co, Pt, Au, or Ag). A barrier pattern (not shown) may further be disposed between the bit line BL and the bit line node contact DC and between the bit line BL and the poly-silicon pattern PP. The barrier pattern may include a conductive metal nitride (e.g., a nitride of Ti, Mo, W, Cu, Al, Ta, Ru, Ir, Co, Pt, Au, or Ag).

A bit line capping pattern BCP may be provided on the bit line BL. For example, each of the bit line capping patterns BCP may be provided on a top surface of a corresponding one of the bit lines BL. For example, each of the bit line capping patterns BCP may extend in the second direction D2 along the corresponding bit line BL, and the bit line capping patterns BCP may be spaced apart from each other in the first direction D1. Each of the bit line capping patterns BCP may vertically overlap with the corresponding bit line BL. The bit line capping pattern BCP may be formed of a single layer or a plurality of layers. For example, the bit line capping pattern BCP may include a first capping pattern (not shown), a second capping pattern (not shown) and a third capping pattern (not shown), which are sequentially stacked. For example, each of the first to third capping patterns may include silicon nitride. In some embodiments, the bit line capping pattern BCP may further include additional capping patterns such as fourth and fifth capping patterns (not shown).

A bit line spacer SPC may be provided on a side surface of the bit line BL and a side surface of the bit line capping pattern BCP. The bit line spacer SPC may cover the side surface of the bit line BL and the side surface of the bit line capping pattern BCP. The bit line spacer SPC may extend in the second direction D2 on the side surface of the bit line BL.

Each of the bit line spacers SPC may include a plurality of sub-spacers. For example, each of the bit line spacers SPC may include three or more sub-spacers sequentially stacked on the side surface of the bit line BL. For example, the sub-spacers may each independently include at least one of silicon nitride, silicon oxide, or silicon oxynitride. In some embodiments, at least one of the sub-spacers may include an air gap separating other sub-spacers from each other.

A storage node contact BC may be provided between the bit lines BL adjacent to each other. The storage node contact BC may be provided in plurality, and the storage node contacts BC may be spaced apart from each other in the first and second directions D1 and D2. The storage node contact BC may fill a second recess region RS2 on the edge portion EA of the active pattern ACT. The storage node contact BC may be electrically connected to the edge portion EA. The storage node contact BC may include a conductive material. For example, the storage node contact BC may include at least one of poly-silicon doped with dopants, or a metal material (e.g., Ti, Mo, W, Cu, Al, Ta, Ru, Ir, Co, Pt, Au, Ag, etc.).

Fence patterns FN may be disposed on the word lines WL to separate the storage node contacts BC from each other in the second direction D2. For example, the fence patterns FN may be spaced apart from each other in the second direction D2 with the storage node contacts BC interposed therebetween. For example, the fence patterns FN may include silicon nitride.

A diffusion barrier layer DP may conformally cover the storage node contact BC and the bit line spacer SPC. The diffusion barrier layer DP may include a conductive metal nitride (e.g., a nitride of Ti, Mo, W, Cu, Al, Ta, Ru, Ir, Co, Pt, Au, or Ag). A metal silicide layer may further be disposed between the diffusion barrier layer DP and the storage node contact BC.

A landing pad LP may be provided on the storage node contact BC. The landing pad LP may be provided in plurality, and the landing pads LP may be spaced apart from each other in the first and second directions D1 and D2. Each of the landing pads LP may be connected to a corresponding one of the storage node contacts BC. The landing pad LP may cover a top surface of the bit line capping pattern BCP. For example, a lower portion of the landing pad LP may vertically overlap with the storage node contact BC, and an upper portion of the landing pad LP may be shifted from the lower portion in the first direction D1 or an opposite direction to the first direction D1. The landing pad LP may include a metal material (e.g., Ti, Mo, W, Cu, Al, Ta, Ru, Ir, Co, Pt, Au, Ag, etc.).

A filling pattern FI may surround the landing pad LP in a plan view. The filling pattern FI may be disposed between the landing pads LP adjacent to each other. The filling pattern FI may have a mesh shape including holes penetrated by the landing pads LP when viewed in a plan view. For example, the filling pattern FI may include at least one of silicon nitride, silicon oxide, or silicon oxynitride. Alternatively, the filling pattern FI may include an empty space (i.e., an air gap) including air.

A capacitor structure CAP, an etch stop layer ES, and a supporting layer SS may be provided on the landing pads LP and the filling pattern FT. The capacitor structure CAP, the etch stop layer ES, and the supporting layer SS may correspond to the capacitor structure CAP, the etch stop layer ES, and the supporting layer SS of FIGS. 6 to 10, respectively. Thus, features of the capacitor structure CAP, the etch stop layer ES, and the supporting layer SS of FIGS. 11 and 12 may be the same/similar as those of the capacitor structure CAP, the etch stop layer ES, and the supporting layer SS of FIGS. 6 to 10, respectively.

Figure 13:
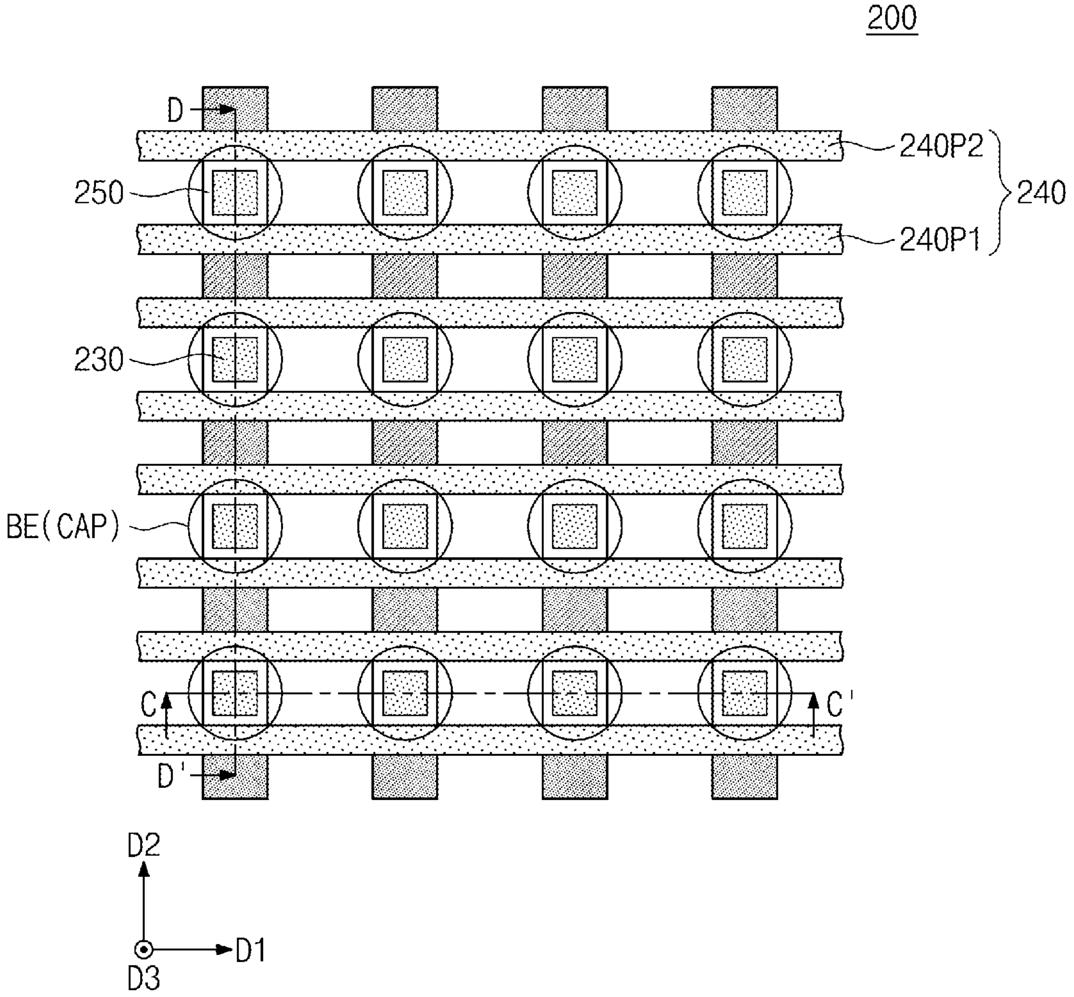
FIG. 13 is a plan view illustrating a semiconductor device according to some embodiments of the inventive concepts.
Figure 14:
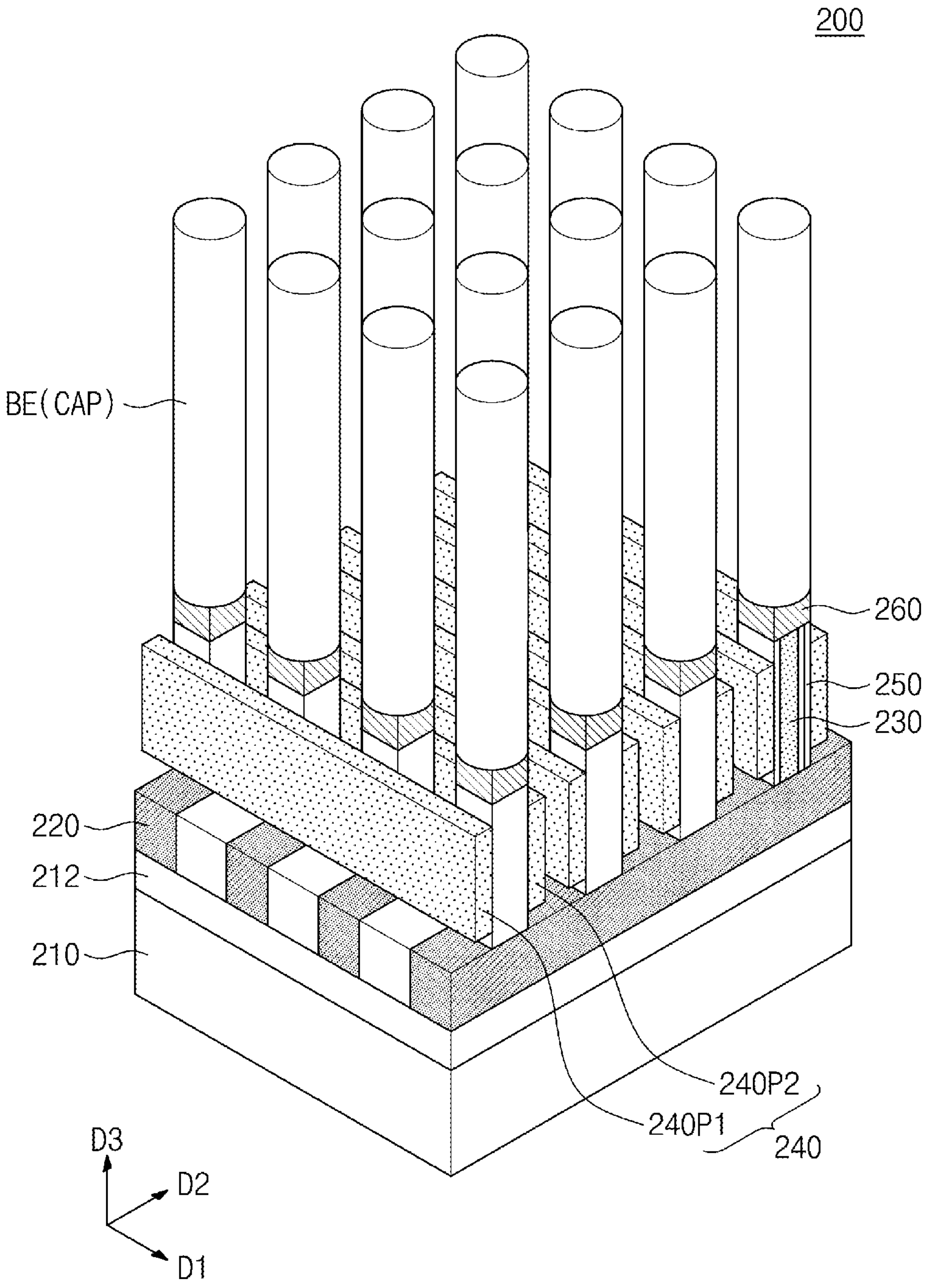
FIG. 14 is a perspective view illustrating the semiconductor device of FIG. 13.
Figure 15:
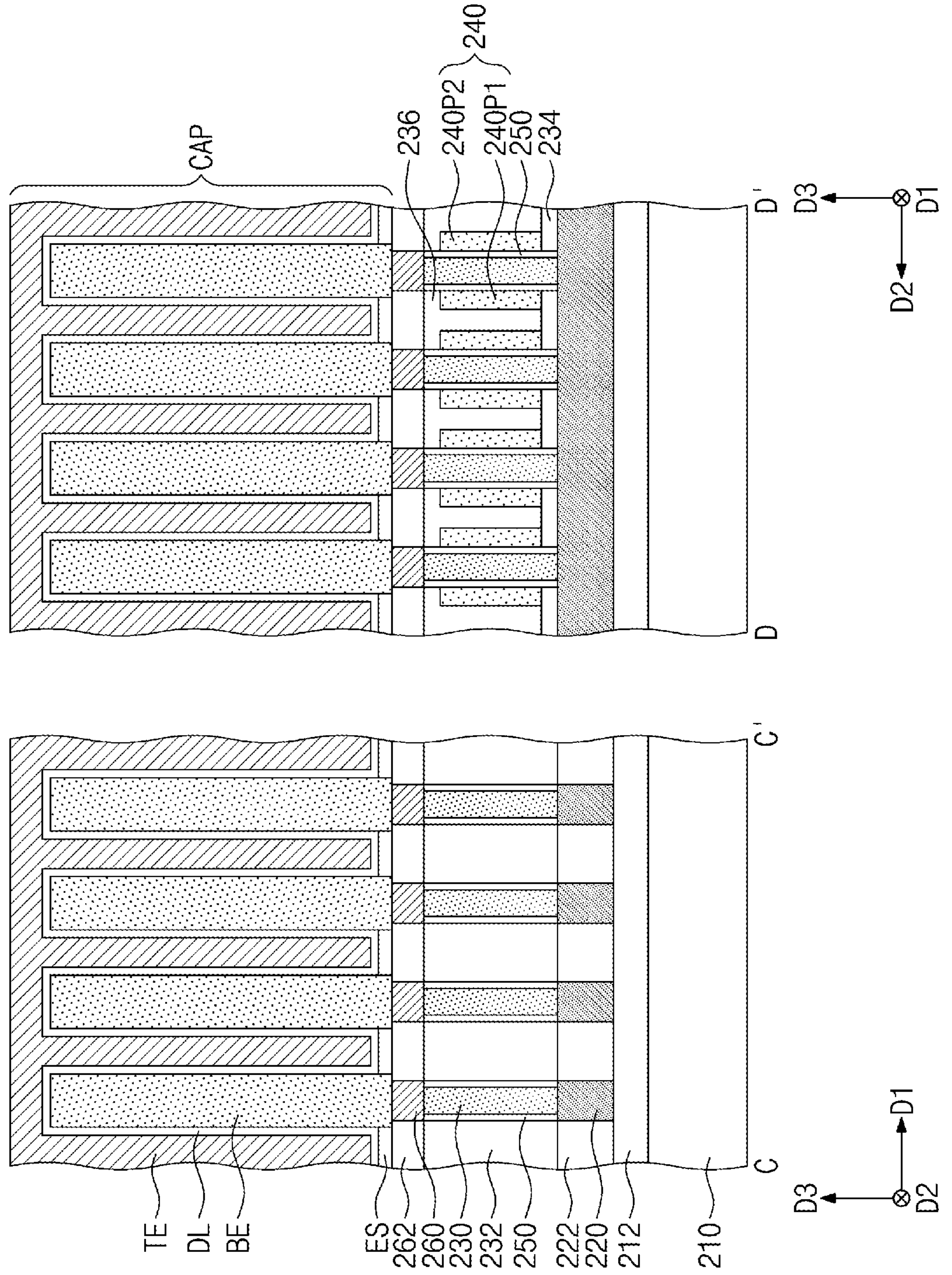
FIG. 15 is a cross-sectional view taken along lines C-C' and D-D' of FIG. 13.

FIG. 13 is a plan view illustrating a semiconductor device according to some embodiments of the inventive concepts. FIG. 14 is a perspective view illustrating the semiconductor device of FIG. 13. FIG. 15 is a cross-sectional view taken along lines C-C' and D-D' of FIG. 13. Hereinafter, the descriptions to the same features as mentioned above will be omitted for the purpose of ease and convenience in explanation.

Referring to FIGS. 13 to 15, a semiconductor device 200 may include a substrate 210, a plurality of first conductive lines 220, a channel layer 230, a gate electrode 240, a gate insulating layer 250, and a capacitor structure CAP. The semiconductor device 200 may be a memory device including a vertical channel transistor (VCT). The vertical channel transistor may have a structure in which a channel length of the channel layer 230 extends from the substrate 210 in a vertical direction (e.g., a third direction D3).

A lower insulating layer 212 may be disposed on the substrate 210, and the plurality of first conductive lines 220 may be spaced apart from each other in a first direction D1 on the lower insulating layer 212 and may extend in a second direction D2. A plurality of first insulating patterns 222 may be disposed on the lower insulating layer 212 to fill spaces between the plurality of first conductive lines 220. The plurality of first insulating patterns 222 may extend in the second direction D2, and top surfaces of the plurality of first insulating patterns 222 may be disposed at substantially the same level (e.g., height) as top surfaces of the plurality of first conductive lines 220. The plurality of first conductive lines 220 may function as bit lines of the semiconductor device 200.

In some embodiments, the plurality of first conductive lines 220 may include at least one of doped poly-silicon, a metal, a conductive metal nitride, a conductive metal silicide, or a conductive metal oxide. For example, the plurality of first conductive lines 220 may be formed of, but are not limited to, at least one of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, or $RuO_x$. The plurality of first conductive lines 220 may include a single layer or multi-layer including at least one of the aforementioned materials. In some embodiments, the plurality of first conductive lines 220 may include a two-dimensional semiconductor material, and for example, the two-dimensional semiconductor material may include graphene, carbon nanotube, or a combination thereof.

The channel layers 230 may be arranged in a matrix form on the plurality of first conductive lines 220 and may be spaced apart from each other in the first direction D1 and the second direction D2. The channel layer 230 may have a first width in the first direction D1 and a first height in the third direction D3, and the first height may be greater than the first width. For example, the first height may range from about 2 times to about 10 times greater than the first width, but embodiments of the inventive concepts are not limited thereto. A bottom portion of the channel layer 230 may function as a first source/drain region (not shown), an upper portion of the channel layer 230 may function as a second source/drain region (not shown), and a portion of the channel layer 230 between the first and second source/drain regions may function as a channel region (not shown).

In some embodiments, the channel layer 230 may include an oxide semiconductor, and for example, the oxide semiconductor may include at least one of $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, or $In_xGa_yO$. The channel layer 230 may include a single layer or multi-layer including at least one of the oxide semiconductors. In some embodiments, the channel layer 230 may have a band gap energy greater than a band gap energy of silicon. For example, the channel layer 230 may have a band gap energy of about 1.5 eV to about 5.6 eV. For example, when the channel layer 230 has a band gap energy of about 2.0 eV to about 4.0 eV, the channel layer 230 may have optimal channel performance. For example, the channel layer 230 may be in a poly-crystalline or amorphous state, but embodiments of the inventive concepts are not limited thereto. In some embodiments, the channel layer 230 may include a two-dimensional semiconductor material, and for example, the two-dimensional semiconductor material may include graphene, carbon nanotube, or a combination thereof.

The gate electrode 240 may extend in the first direction D1 on both side surfaces of the channel layer 230. The gate electrode 240 may include a first sub-gate electrode 240P1 facing a first side surface of the channel layer 230, and a second sub-gate electrode 240P2 facing a second side surface of the channel layer 230 opposite to the first side surface. The channel layer 230 may be disposed between the first sub-gate electrode 240P1 and the second sub-gate electrode 240P2, and thus the semiconductor device 200 may have a dual gate transistor structure. However, embodiments of the inventive concepts are not limited thereto, and in some embodiments, the semiconductor device 200 may have a single gate transistor structure in which the second sub-gate electrode 240P2 is omitted and the first sub-gate electrode 240P1 facing the first side surface of the channel layer 230 is formed.

The gate electrode 240 may include at least one of doped poly-silicon, a metal, a conductive metal nitride, a conductive metal silicide, or a conductive metal oxide. For example, the gate electrode 240 may be formed of, but is not limited to, at least one of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, or $RuO_x$.

The gate insulating layer 250 may surround side surfaces of the channel layer 230 and may be disposed between the channel layer 230 and the gate electrode 240. In some embodiments, as shown in FIG. 13, an entire side surface of the channel layer 230 may be surrounded by the gate insulating layer 250, and a portion of a side surface of the gate electrode 240 may be in contact with the gate insulating layer 250. In some embodiments, the gate insulating layer 250 may extend in an extending direction (i.e., the first direction D1) of the gate electrode 240, and two of the side surfaces of the channel layer 230, which face the gate electrode 240, may be in contact with the gate insulating layer 250.

In some embodiments, the gate insulating layer 250 may be formed of at least one of a silicon oxide layer, a silicon oxynitride layer, or a high-k dielectric layer having a dielectric constant higher than that of the silicon oxide layer. The high-k dielectric layer may be formed of a metal oxide or a metal oxynitride. For example, the high-k dielectric layer usable as the gate insulating layer 250 may be formed of, but is not limited to, at least one of $HfO_2$, HfSiO, HfSiON, HfTaO, HfTiO, HfZrO, $ZrO_2$, or $Al_2O_3$.

A plurality of second insulating patterns 232 may extend in the second direction D2 on the plurality of first insulating patterns 222, and the channel layer 230 may be disposed between adjacent two of the plurality of second insulating patterns 232. In addition, a first filling layer 234 and a second filling layer 236 may be disposed in a space between two adjacent channel layers 230. The first filling layer 234 may be disposed in a bottom portion of the space between the two adjacent channel layers 230, and the second filling layer 236 may be formed on the first filling layer 234 to fill a remaining portion of the space between the two adjacent channel layers 230. A top surface of the second filling layer 236 may be disposed at substantially the same level (e.g., height) as a top surface of the channel layer 230, and the second filling layer 236 may cover a top surface of the gate electrode 240. Alternatively, the plurality of second insulating patterns 232 may be connected to the plurality of first insulating patterns 222 without an interface therebetween, and/or the second filling layer 236 may be connected to the first filling layer 234 without an interface therebetween.

A capacitor contact 260 may be disposed on the channel layer 230. The capacitor contact 260 may vertically overlap with the channel layer 230, and the capacitor contacts 260 may be arranged in a matrix form and may be spaced apart from each other in the first direction D1 and the second direction D2. The capacitor contact 260 may be formed of, but is not limited to, at least one of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, or $RuO_x$. An upper insulating layer 262 may be disposed on the plurality of second insulating patterns 232 and the second filling layer 236 to surround a side surface of the capacitor contact 260.

An etch stop layer ES may be disposed on the upper insulating layer 262, and a capacitor structure CAP may be disposed on the etch stop layer ES. The capacitor structure CAP may correspond to one of the capacitor structures CAP of FIGS. 1 to 5 and thus may include the lower electrode BE, the dielectric layer DL, the upper electrode TE, and the defect preventing layer PV.

The lower electrode BE may penetrate the etch stop layer ES so as to be electrically connected to a top surface of the capacitor contact 260. The lower electrode BE may have a pillar shape extending in the third direction D3, but embodiments of the inventive concepts are not limited thereto. In some embodiments, the lower electrode BE may vertically overlap with the capacitor contact 260, and the lower electrodes BE may be spaced apart from each other in the first direction D1 and the second direction D2 and may be arranged in a matrix form. Alternatively, a landing pad (not shown) may further be disposed between the capacitor contact 260 and the lower electrode BE, and thus the lower electrodes BE may be arranged in a hexagonal form.

Figure 16:
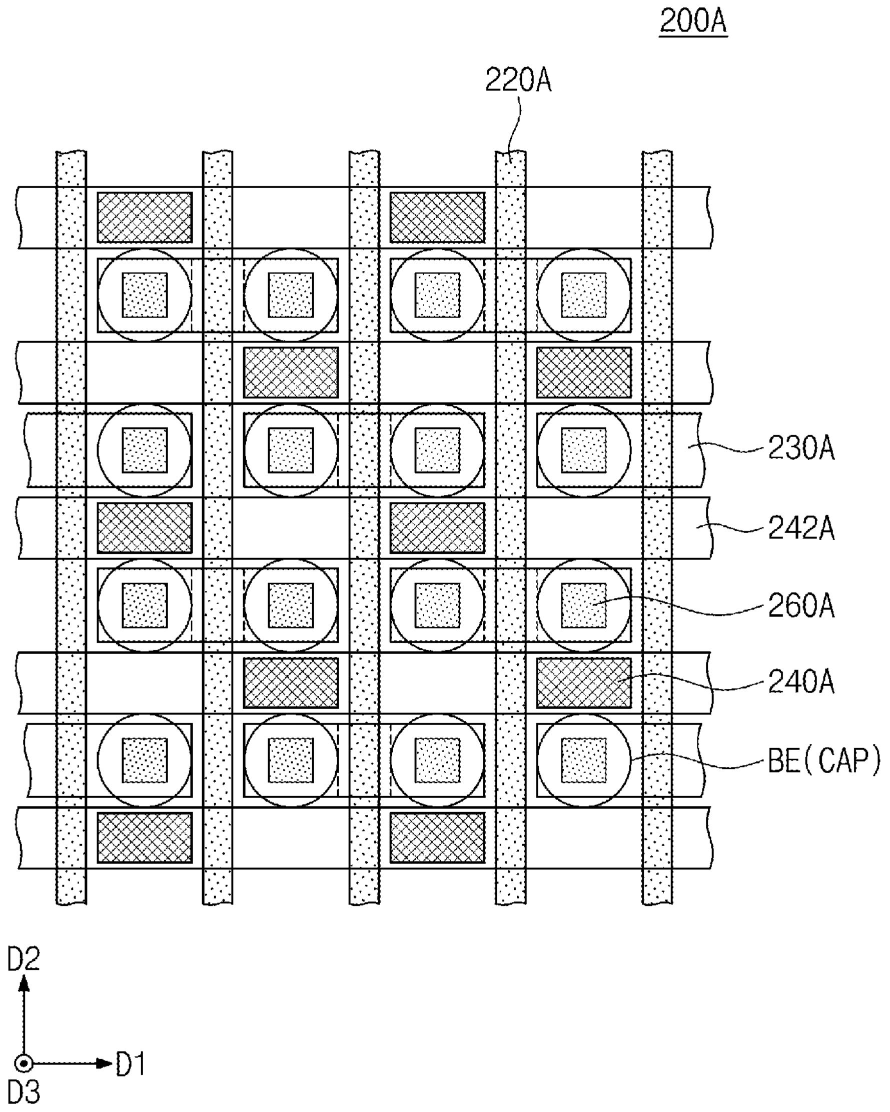
FIG. 16 is a plan view illustrating a semiconductor device according to some embodiments of the inventive concepts.
Figure 17:
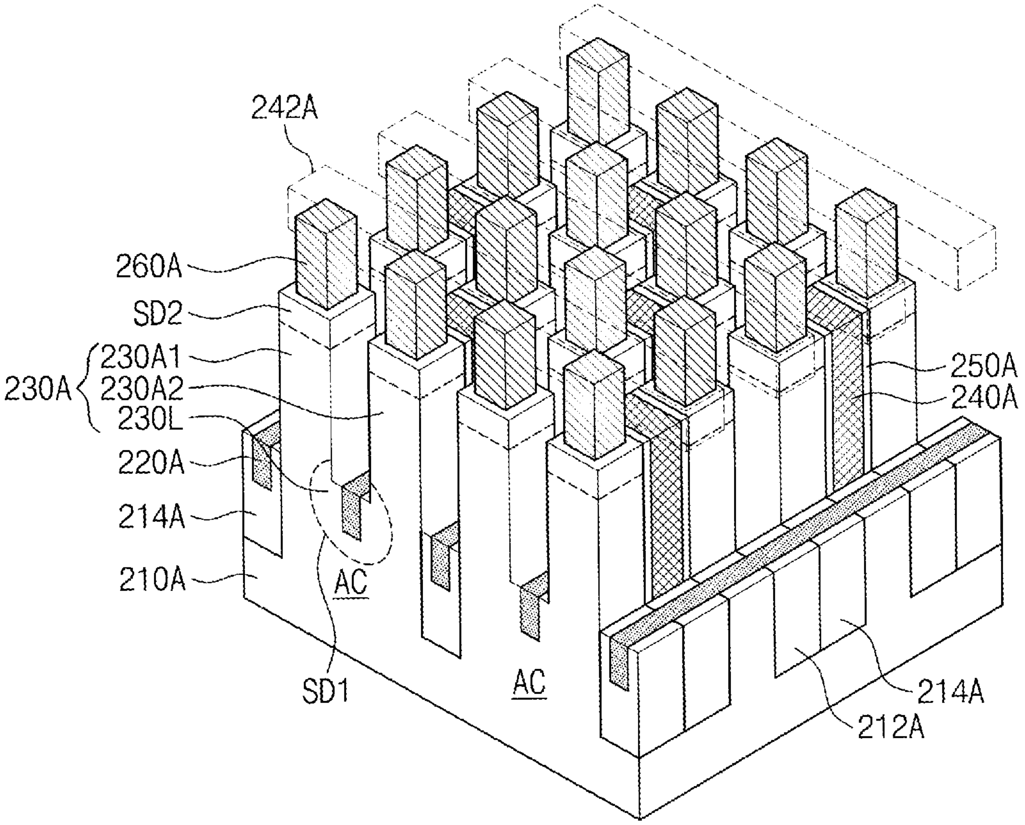
FIG. 17 is a perspective view illustrating the semiconductor device of FIG. 16.

FIG. 16 is a plan view illustrating a semiconductor device according to some embodiments of the inventive concepts. FIG. 17 is a perspective view illustrating the semiconductor device of FIG. 16. Hereinafter, the descriptions to the same features as mentioned above will be omitted for the purpose of ease and convenience in explanation.

Referring to FIGS. 16 and 17, a semiconductor device 200A may include a substrate 210A, a plurality of first conductive lines 220A, a channel structure 230A, a contact gate electrode 240A, a plurality of second conductive lines 242A, and a capacitor structure CAP. The semiconductor device 200A may be a memory device including a vertical channel transistor (VCT).

A plurality of active regions AC may be defined in the substrate 210A by a first device isolation layer 212A and a second device isolation layer 214A. The channel structure 230A may be disposed in each of the active regions AC, and the channel structure 230A may include a first active pillar 230A1 and a second active pillar 230A2 which extend in a vertical direction (e.g., a third direction D3), and a connecting portion 230L connected to a bottom portion of the first active pillar 230A1 and a bottom portion of the second active pillar 230A2. A first source/drain region SD1 may be disposed in the connecting portion 230L, and a second source/drain region SD2 may be disposed in each of upper portions of the first and second active pillars 230A1 and 230A2. The first active pillar 230A1 and the second active pillar 230A2 may form unit memory cells independent of each other, respectively.

The plurality of first conductive lines 220A may extend in a direction (e.g., a second direction D2) intersecting each of the plurality of active regions AC. One of the plurality of first conductive lines 220A may be disposed on the connecting portion 230L between the first active pillar 230A1 and the second active pillar 230A2, and the one first conductive line 220A may be disposed on the first source/drain region SD1. Another first conductive line 220A adjacent to the one first conductive line 220A may be disposed between two channel structures 230A. One of the plurality of first conductive lines 220A may function as a common bit line included in two unit memory cells formed by the first active pillar 230A1 and the second active pillar 230A2 which are disposed at both sides of the one first conductive line 220A.

One contact gate electrode 240A may be disposed between two channel structures 230A adjacent to each other in the second direction D2. For example, the one contact gate electrode 240A may be disposed between the first active pillar 230A1 of one channel structure 230A and the second active pillar 230A2 of another channel structure 230A adjacent thereto, and the one contact gate electrode 240A may be shared by the first active pillar 230A1 and the second active pillar 230A2 which are disposed on both side surfaces of the one contact gate electrode 240A. A gate insulating layer 250A may be disposed between the contact gate electrode 240A and the first active pillar 230A1 and between the contact gate electrode 240A and the second active pillar 230A2. The second conductive line 242A may extend in a first direction D1 on a top surface of the contact gate electrode 240A. The plurality of second conductive lines 242A may function as word lines of the semiconductor device 200A.

A capacitor contact 260A may be disposed on the channel structure 230A. The capacitor contact 260A may be disposed on the second source/drain region SD2, and the capacitor structure CAP may be disposed on the capacitor contact 260A. The capacitor structure CAP may correspond to one of the capacitor structures CAP of FIGS. 1 to 5 and thus may include the lower electrode BE, the dielectric layer DL, the upper electrode TE, and the defect preventing layer PV.

According to aspects of the inventive concepts, the defect preventing layer may inhibit defects in the dielectric layer, and thus the dipole pinning phenomenon may be reduced or minimized. In addition, the defect preventing layer may form the non-polarization region in the ferroelectric layer, and thus the dipole propagation phenomenon may be minimized or prevented. As a result, the electrical characteristics and reliability of the semiconductor device may be improved.

As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof.

While example embodiments of the inventive concepts have been particularly shown and described, it will be understood by one of ordinary skill in the art that variations in form and detail may be made therein without departing from the scope of the attached claims.

What is claimed is:

1. A semiconductor device comprising:

a capacitor structure, the capacitor structure comprising:

a lower electrode;

a dielectric layer on the lower electrode;

an upper electrode on the dielectric layer; and a defect preventing layer between the lower electrode and the upper electrode, wherein the defect preventing layer comprises at least one of a first defect preventing layer between the lower electrode and the dielectric layer or a second defect preventing layer between the upper electrode and the dielectric layer, wherein the dielectric layer comprises a ferroelectric layer that includes at least one of a ferroelectric material or an anti-ferroelectric material, and wherein the ferroelectric layer comprises a polarization region and a non-polarization region surrounded by the polarization region.

2. The semiconductor device of claim 1, wherein the lower electrode, the dielectric layer, and the upper electrode are stacked in a vertical direction, and wherein a thickness, in the vertical direction, of each of the first defect preventing layer and the second defect preventing layer is greater than 0 Å and is equal to or less than about 10 Å.

3. The semiconductor device of claim 1, further comprising impurities in the defect preventing layer.

4. The semiconductor device of claim 1, wherein the defect preventing layer comprises at least one of silicon oxide or a metal oxide.

5. The semiconductor device of claim 1, wherein a thermal expansion coefficient of the defect preventing layer is less than a thermal expansion coefficient of the dielectric layer.

6. The semiconductor device of claim 1, wherein a thermal expansion coefficient of the first defect preventing layer is less than a thermal expansion coefficient of the lower electrode, and wherein a thermal expansion coefficient of the second defect preventing layer is less than a thermal expansion coefficient of the upper electrode.

7. The semiconductor device of claim 1, wherein each of the first defect preventing layer and the second defect preventing layer comprises one or more layers.

8. The semiconductor device of claim 1, wherein the ferroelectric layer comprises one or more layers.

9. The semiconductor device of claim 1, wherein the dielectric layer further comprises a paraelectric layer that includes a paraelectric material, and wherein the paraelectric layer comprises one or more layers.

10. The semiconductor device of claim 1, wherein a volume of the non-polarization region in the ferroelectric layer is in a range of about 5% to about 30% of a total volume of the ferroelectric layer.

11. A semiconductor device comprising:

a capacitor structure, the capacitor structure comprising:

a lower electrode;

a dielectric layer on the lower electrode;

an upper electrode on the dielectric layer; and a defect preventing layer between the lower electrode and the upper electrode, wherein the defect preventing layer comprises at least one of a first defect preventing layer between the lower electrode and the dielectric layer or a second defect preventing layer between the upper electrode and the dielectric layer, and wherein a thermal expansion coefficient of the defect preventing layer is less than a thermal expansion coefficient of the dielectric layer.

12. The semiconductor device of claim 11, wherein a thermal expansion coefficient of the first defect preventing layer is less than a thermal expansion coefficient of the lower electrode, and wherein a thermal expansion coefficient of the second defect preventing layer is less than a thermal expansion coefficient of the upper electrode.

13. The semiconductor device of claim 11, wherein the thermal expansion coefficient of the defect preventing layer is greater than 0 m/K and is equal to or less than about $5\times10^{-6}$ m/K.

14. The semiconductor device of claim 11, wherein the defect preventing layer provides tensile stress to the dielectric layer.

15. A semiconductor device comprising:

a substrate;

conductive contacts on the substrate;

lower electrodes on the conductive contacts;

a dielectric layer on the lower electrodes;

an upper electrode on the dielectric layer; and a defect preventing layer between the upper electrode and the lower electrodes, wherein the defect preventing layer comprises at least one of a first defect preventing layer between the dielectric layer and the lower electrodes or a second defect preventing layer between the upper electrode and the dielectric layer, wherein the dielectric layer comprises a ferroelectric layer that includes at least one of a ferroelectric material or an anti-ferroelectric material, and wherein the ferroelectric layer comprises a polarization region and a non-polarization region surrounded by the polarization region.

16. The semiconductor device of claim 15, further comprising a supporting layer between the lower electrodes, wherein the defect preventing layer is between the supporting layer and the upper electrode.

17. The semiconductor device of claim 15, further comprising an etch stop layer between the substrate and the upper electrode, wherein the defect preventing layer is between the etch stop layer and the upper electrode.

18. The semiconductor device of claim 15, wherein each of the lower electrodes has a pillar shape or a cylinder shape.

19. The semiconductor device of claim 15, wherein a thermal expansion coefficient of the defect preventing layer is less than a thermal expansion coefficient of the dielectric layer.

20. The semiconductor device of claim 15, wherein a volume of the non-polarization region in the ferroelectric layer is in a range of about 5% to about 30% of a total volume of the ferroelectric layer.

* * * * *